(12) United States Patent
Liu et al.

(10) Patent No.: US 12,437,990 B2
(45) Date of Patent: Oct. 7, 2025

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Wei-Min Liu, Hsinchu (TW); Li-Li Su, Chubei (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 1075 days.

(21) Appl. No.: 17/238,808

(22) Filed: Apr. 23, 2021

(65) Prior Publication Data
US 2022/0344151 A1    Oct. 27, 2022

(51) Int. Cl.
*H01L 21/02*    (2006.01)
*C23C 16/02*    (2006.01)
(Continued)

(52) U.S. Cl.
CPC ...... *H01L 21/0262* (2013.01); *C23C 16/0227* (2013.01); *C23C 16/08* (2013.01); *C23C 16/50* (2013.01); *C23C 16/56* (2013.01); *C30B 25/105* (2013.01); *C30B 25/14* (2013.01); *C30B 25/186* (2013.01); *C30B 29/52* (2013.01); *H01J 37/05* (2013.01); *H01J 37/3244* (2013.01); *H01L 21/02532* (2013.01); *H01L 21/02661* (2013.01); *H01L 21/28088* (2013.01); *H01L 21/3065* (2013.01); *H10D 30/024* (2025.01); *H10D 30/43* (2025.01); *H10D 30/6211* (2025.01); *H10D 30/6713* (2025.01); *H10D 30/6735* (2025.01); *H10D 30/6757* (2025.01);
(Continued)

(58) Field of Classification Search
CPC .......... H01L 21/02532; H01L 21/0262; H01L 21/02661; H01L 21/28088; H01L 21/3065; H01L 21/823814; H01L 21/823821; H01L 21/823842; H01L 21/823864; H01L 21/823871; H01L 27/0924; H01L 29/0665; H01L 29/0673; H01L 29/0847; H01L 29/165; H01L 29/42392; H01L 29/66545; H01L 29/66636; H01L 29/66795; H01L 29/78391; H01L 29/775; H01L 29/7848; H01L 29/7851; H01L 29/78618; H01L 29/78696; C23C 16/0227; C23C 16/08; C23C 16/50; C23C 16/56; C30B 25/105; C30B 25/14; C30B 25/186; C30B 29/52
See application file for complete search history.

(56) References Cited

U.S. PATENT DOCUMENTS

2013/0234157 A1*  9/2013  Arena .................. C30B 29/403
                                                            438/478
2016/0079062 A1*  3/2016  Zheng .................. C23C 16/481
                                                            438/498
(Continued)

*Primary Examiner* — Brook Kebede
(74) *Attorney, Agent, or Firm* — Slater Matsil, LLP

(57) ABSTRACT

A method includes flowing first precursors over a semiconductor substrate to form an epitaxial region, the epitaxial region includes a first element and a second element; converting a second precursor into first radicals and first ions; separating the first radicals from the first ions; and flowing the first radicals over the epitaxial region to remove at least some of the second element from the epitaxial region.

20 Claims, 33 Drawing Sheets

(51) Int. Cl.
  *C23C 16/08* (2006.01)
  *C23C 16/50* (2006.01)
  *C23C 16/56* (2006.01)
  *C30B 25/10* (2006.01)
  *C30B 25/14* (2006.01)
  *C30B 25/18* (2006.01)
  *C30B 29/52* (2006.01)
  *H01J 37/05* (2006.01)
  *H01J 37/32* (2006.01)
  *H01L 21/28* (2006.01)
  *H01L 21/3065* (2006.01)
  *H10D 30/01* (2025.01)
  *H10D 30/43* (2025.01)
  *H10D 30/62* (2025.01)
  *H10D 30/67* (2025.01)
  *H10D 30/69* (2025.01)
  *H10D 62/00* (2025.01)
  *H10D 62/10* (2025.01)
  *H10D 62/13* (2025.01)
  *H10D 62/822* (2025.01)
  *H10D 64/01* (2025.01)
  *H10D 84/01* (2025.01)
  *H10D 84/03* (2025.01)
  *H10D 84/85* (2025.01)

(52) U.S. Cl.
  CPC ......... *H10D 30/701* (2025.01); *H10D 30/797* (2025.01); *H10D 62/021* (2025.01); *H10D 62/118* (2025.01); *H10D 62/121* (2025.01); *H10D 62/151* (2025.01); *H10D 62/822* (2025.01); *H10D 64/017* (2025.01); *H10D 84/017* (2025.01); *H10D 84/0177* (2025.01); *H10D 84/0184* (2025.01); *H10D 84/0186* (2025.01); *H10D 84/0193* (2025.01); *H10D 84/038* (2025.01); *H10D 84/853* (2025.01); *H01J 2237/3321* (2013.01)

(56) References Cited

U.S. PATENT DOCUMENTS

2018/0211881 A1\* 7/2018 Zhang ............... H01L 29/41791
2020/0135900 A1\* 4/2020 Lee .................. H01L 29/66545

\* cited by examiner

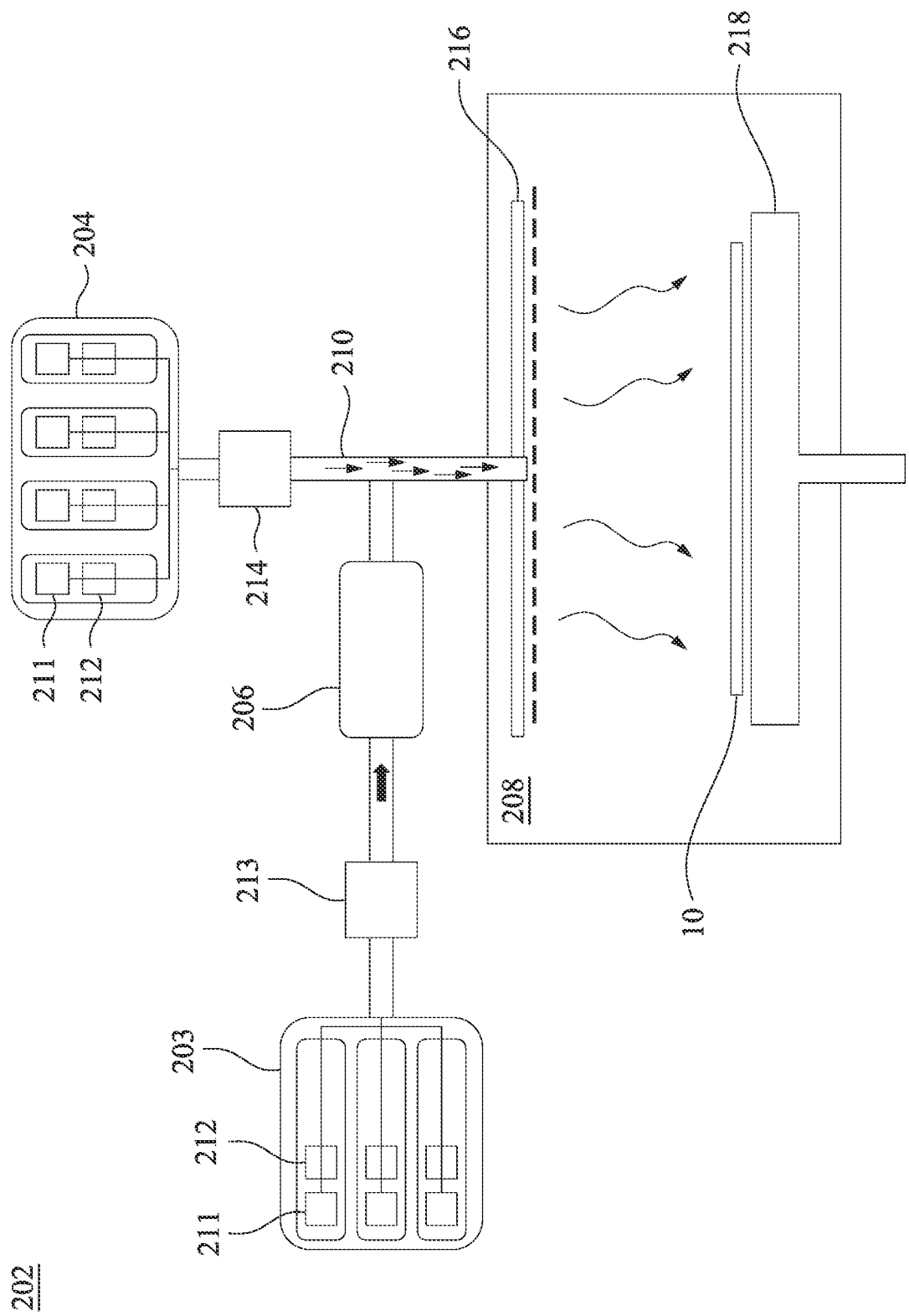

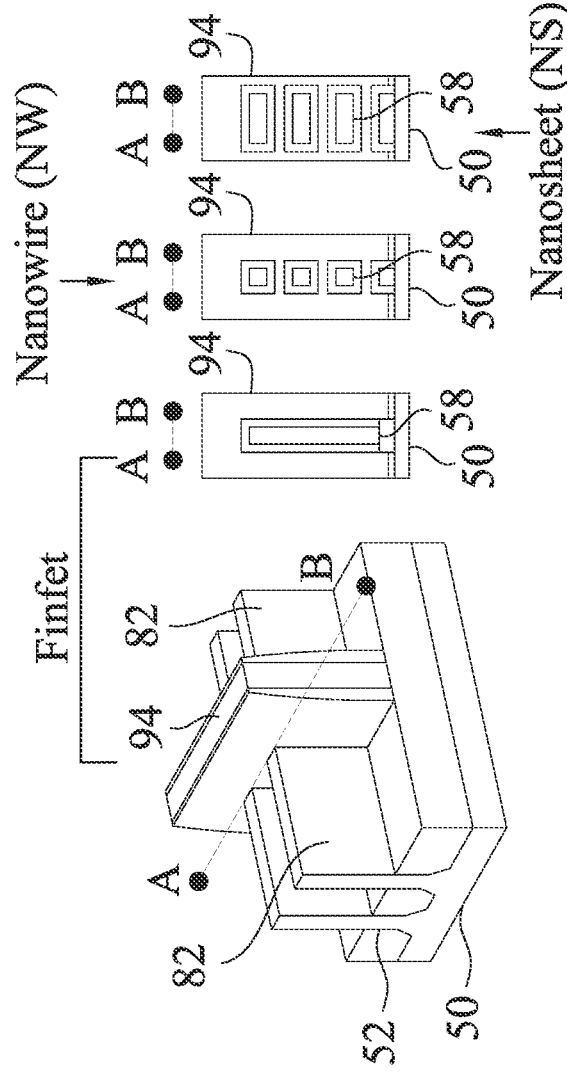
Fig. 29A
Fig. 29B
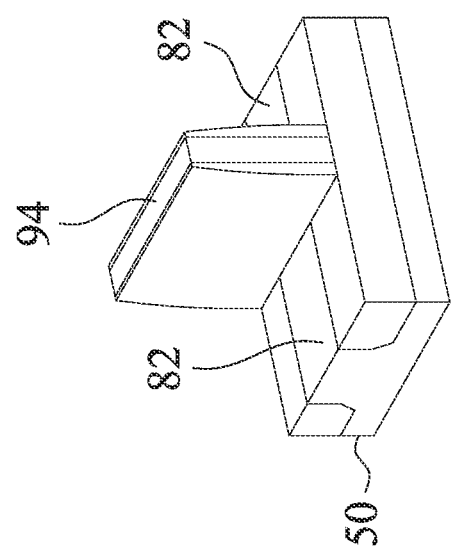
Fig. 29C
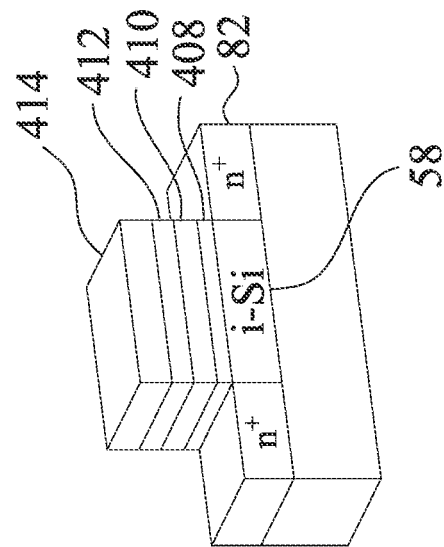
Fig. 29D
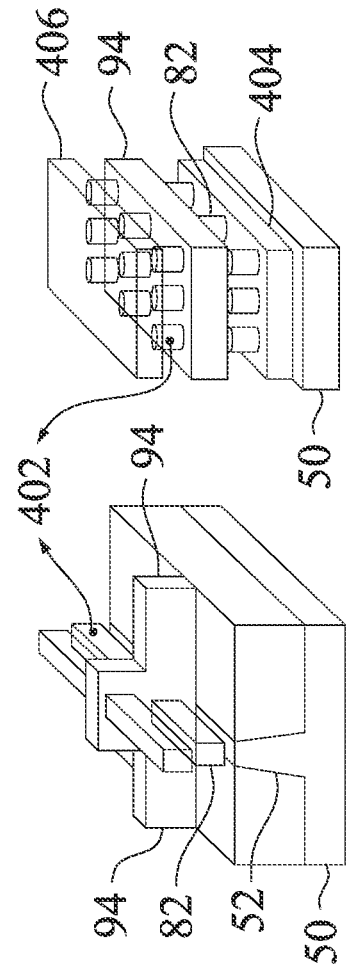

SEMICONDUCTOR DEVICE AND METHOD OF MANUFACTURE

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 11-12 are schematics of portions of a processing system, in accordance with some embodiments.

FIGS. 29A, 29B, 29C, and 29D illustrate examples of semiconductor devices in three-dimensional views, in accordance with some embodiments.

DETAILED DESCRIPTION

Figure 1:
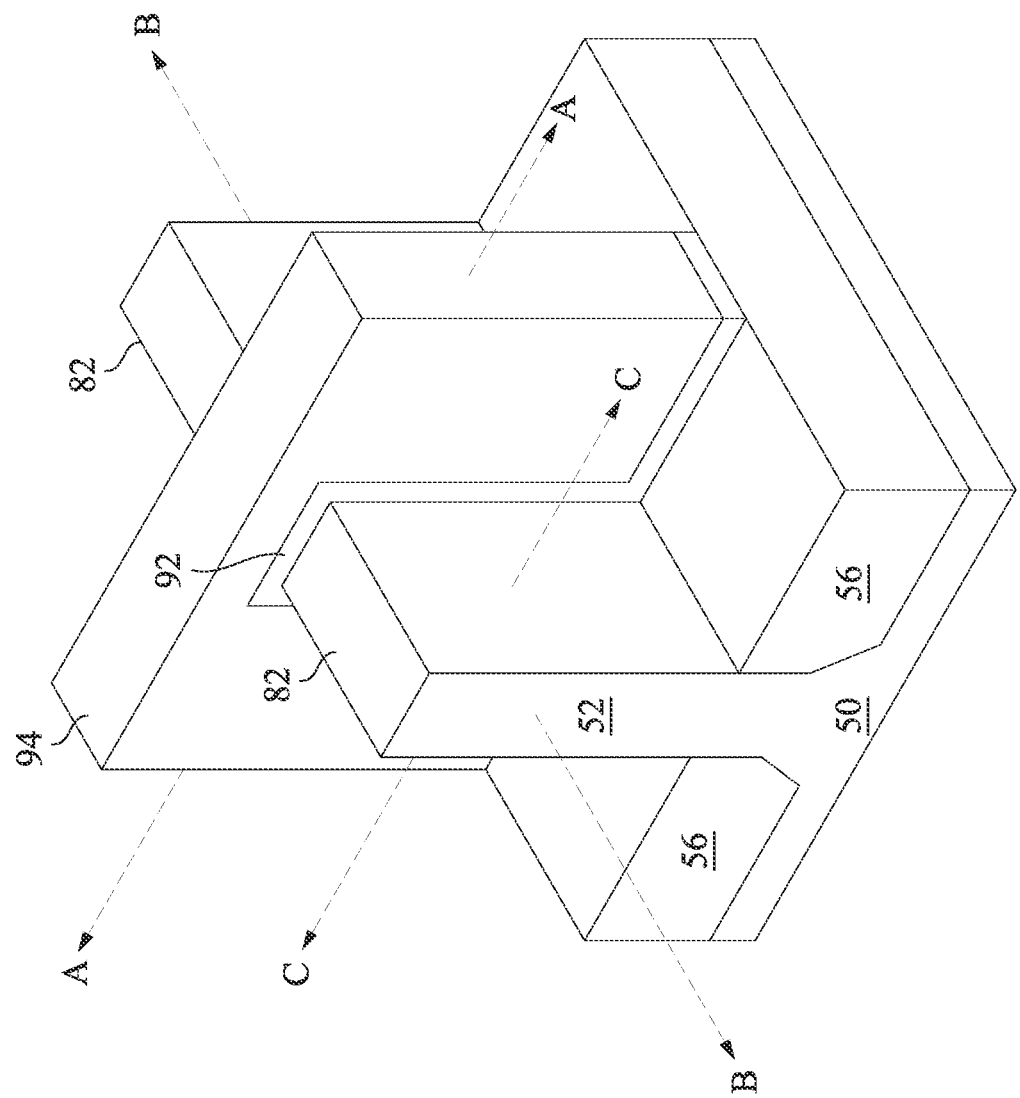
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to particular examples including integrated circuits comprising transistors, such as fin field-effect transistors (FinFETs). However, embodiments are not limited to the examples provided herein, and the ideas may be implemented in a wide array of embodiments.

FIG. 1 illustrates an example of a FinFET in a three-dimensional view formed on a wafer 10, in accordance with some embodiments. The FinFET comprises a fin 52 on a substrate 50 (e.g., a semiconductor substrate) on the wafer 10. Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2 through 10D and 23A through 28B are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 10A, 23A, 24A, 25A, 26A, 27A, and 28A are also illustrated along reference cross-section A-A illustrated in FIG. 1, and FIGS. 8B, 9B, 10B, 23B, 24B, 25B, 26B, 26C, 27B, and 28B are illustrated along a similar cross-section B-B illustrated in FIG. 1, except for multiple fins/FinFETs. FIGS. 10C and 10D are illustrated along reference cross-section C-C illustrated in FIG. 1, except for multiple fins/FinFETs.

Figure 2:
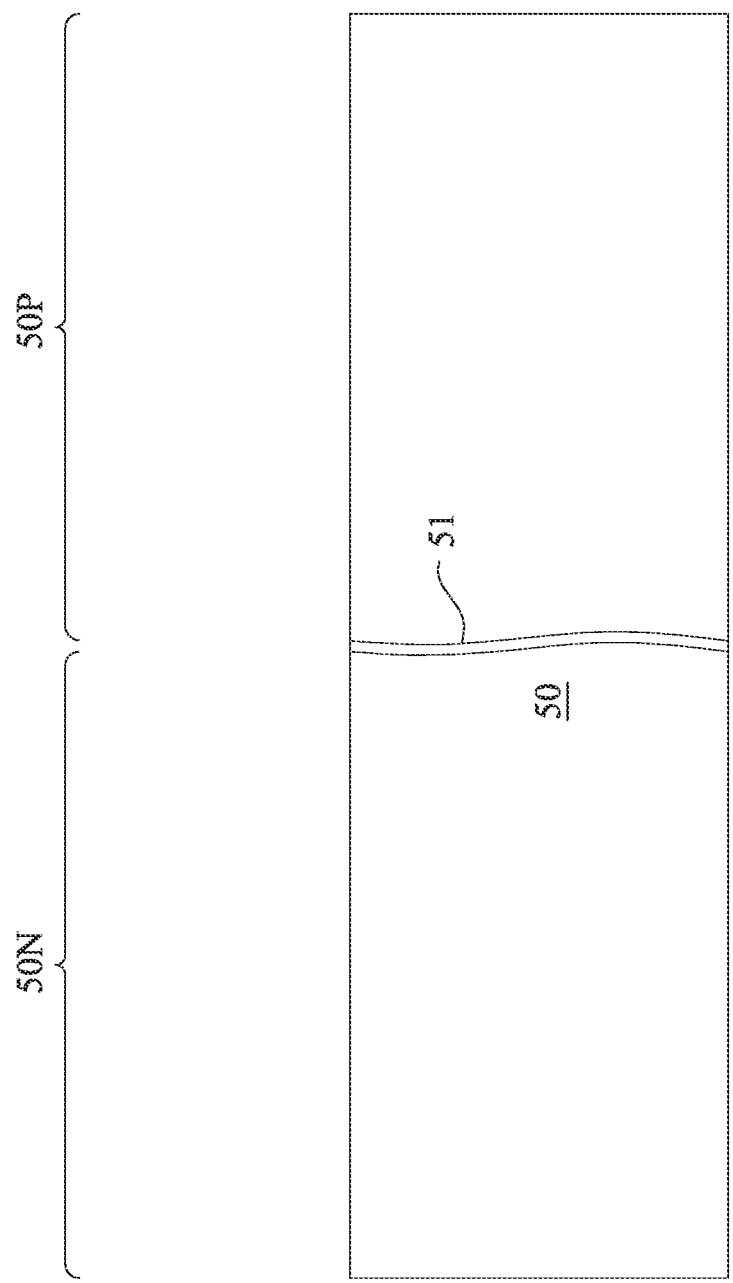
FIGS. 2, 3, 4, 5, 6, 7, 8A, 8B, 9A, 9B, 10A, 10B, 10C, and 10D are cross-sectional views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, for example, n-type FinFETs. The p-type region 50P can be for forming p-type devices, such as PMOS transistors, for example, p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P.

In some embodiments, the substrate 50 or a portion of the substrate 50 may be formed of silicon or silicon germanium by epitaxially growing the portion over a lower portion of the substrate 50, which may comprise a material such as silicon. For example, in some embodiments, the n-type region 50N of the substrate 50 may already comprise silicon or comprise silicon that is epitaxially grown, and the p-type region 50P of the substrate 50 may comprise silicon germanium that is epitaxially grown. As will be discussed in greater detail below (see FIGS. 19-26), the p-type region 50P may be masked while epitaxially growing silicon in the n-type region 50N, and/or the n-type region 50N may be masked while epitaxially growing silicon germanium in the p-type region 50P. Alternatively, the n-type region 50N (which may already comprise silicon) may be masked in order to etch a portion of the p-type region 50P in order to epitaxially grow silicon germanium in the p-type region 50P. The epitaxial growth processes may include one or more growth steps, treatment steps, and etching steps.

Figure 3:
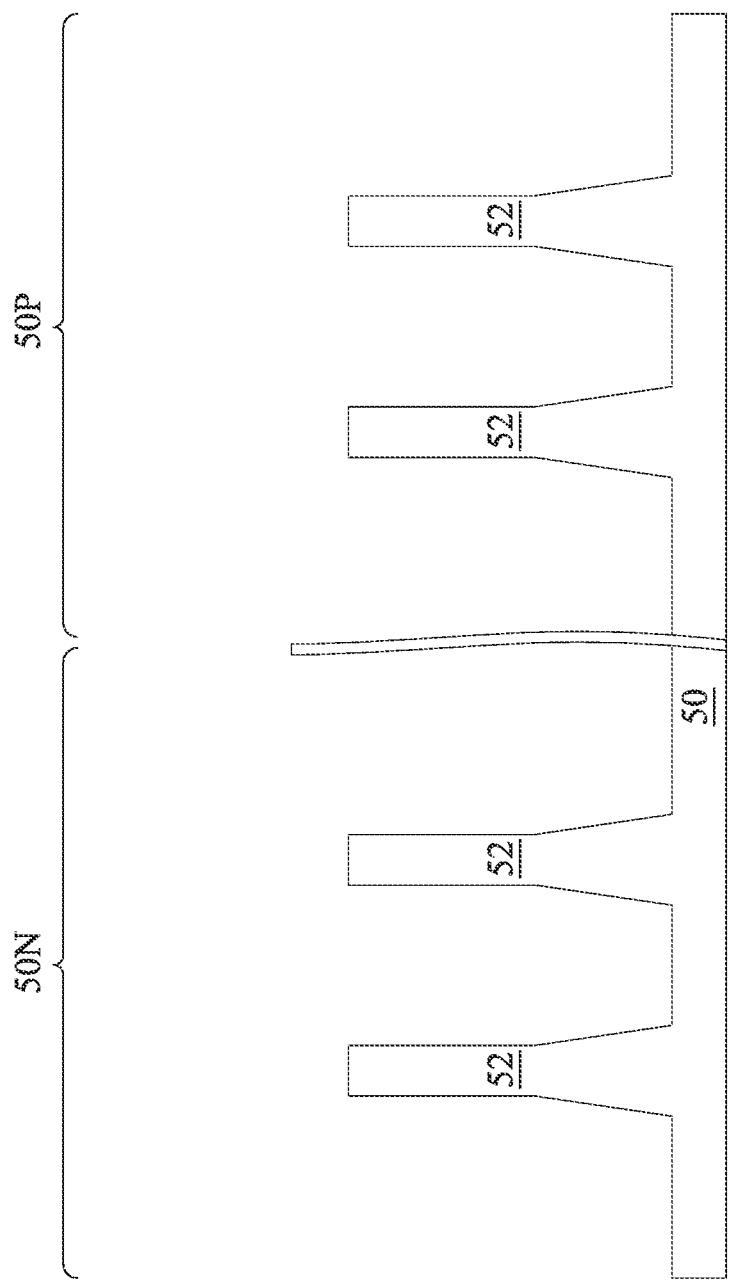

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
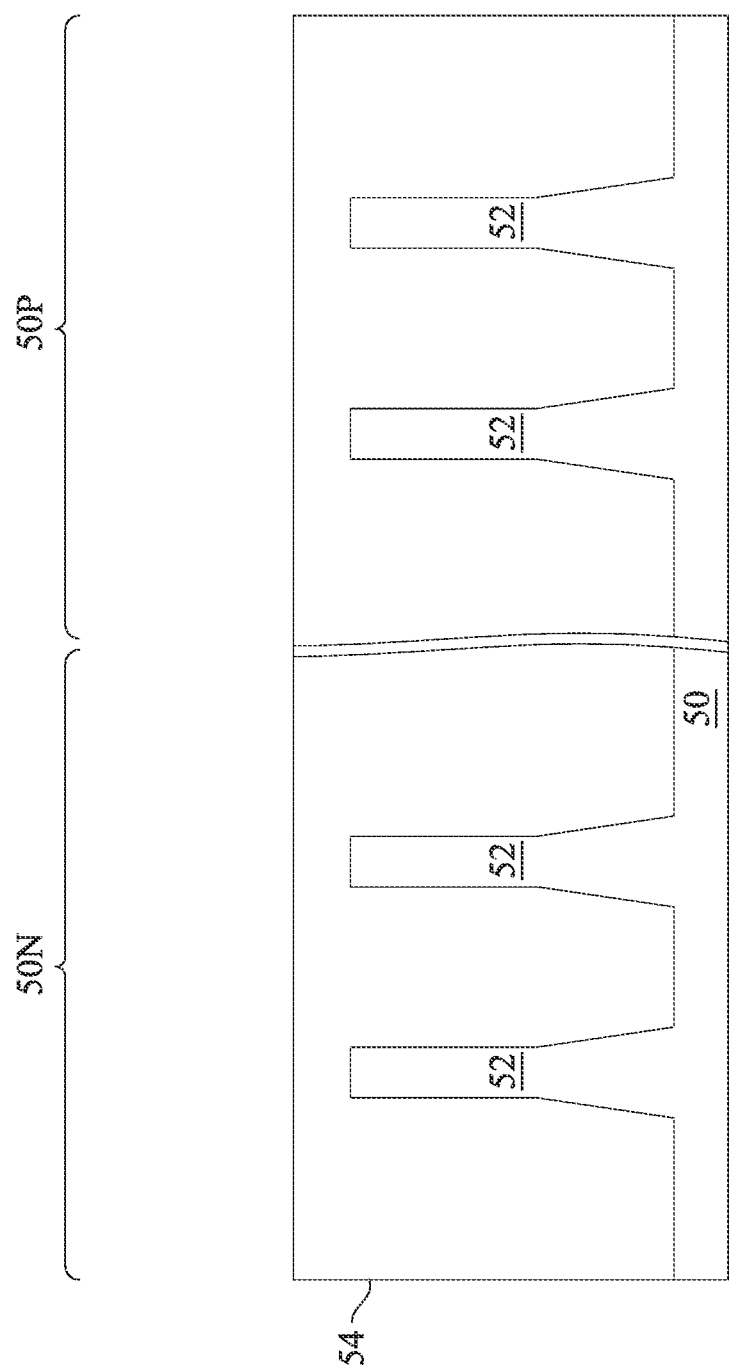

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not specifically illustrated) may first be formed along a surface of the substrate 50 and the fins 52. Thereafter, a fill material, such as those discussed above may be formed over the liner.

Figure 5:
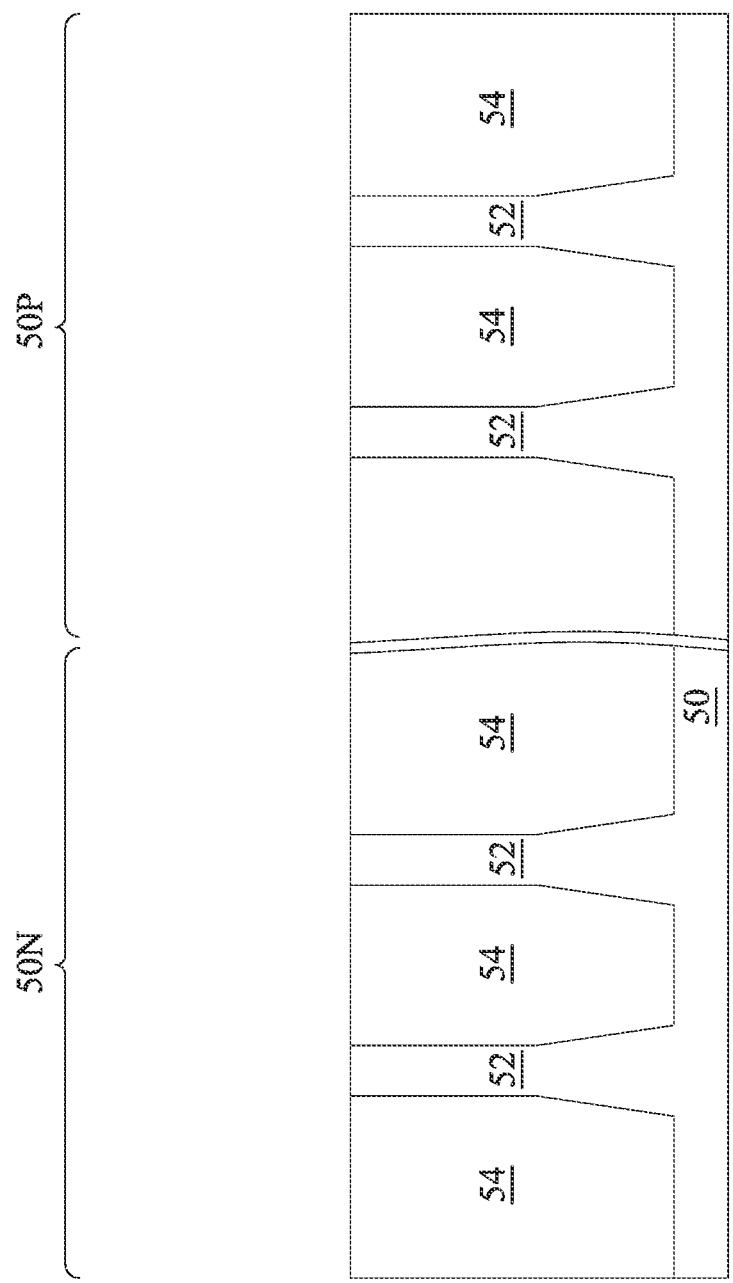

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
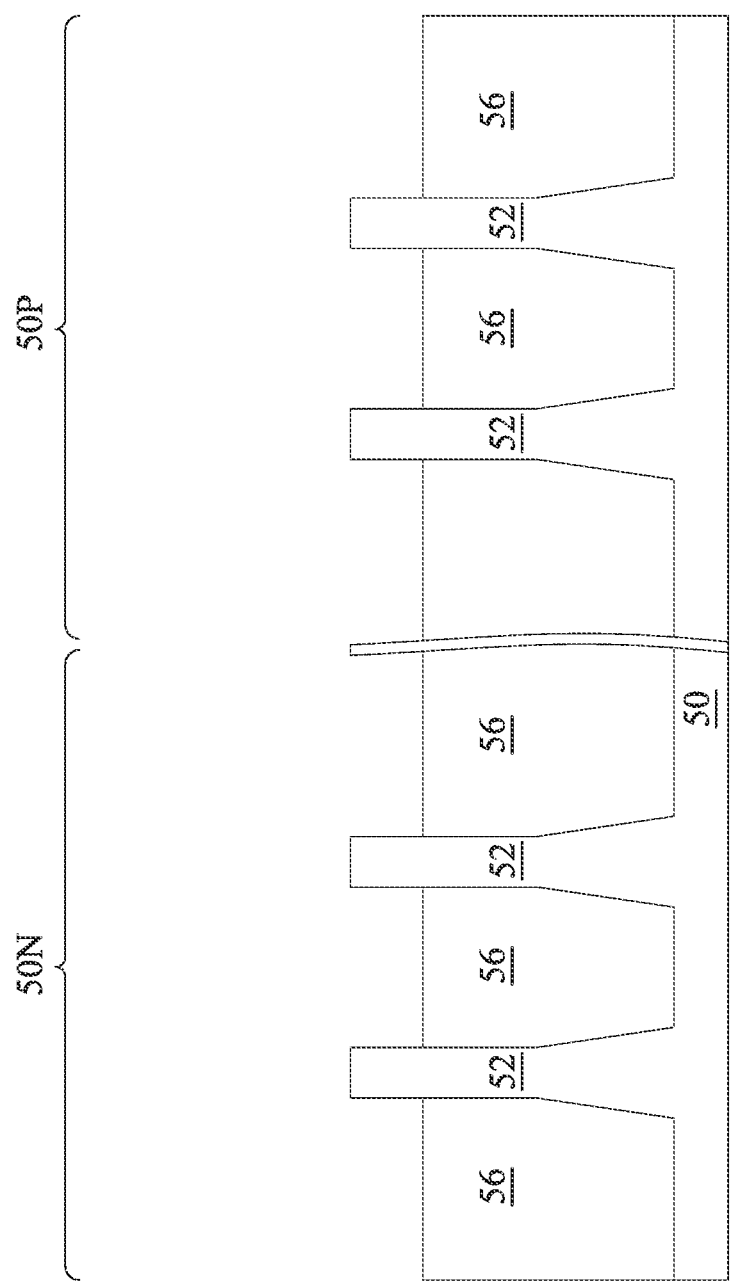

In FIG. 6, the insulation material 54 is recessed to form Shallow Trench Isolation (STI) regions 56. The insulation material 54 is recessed such that upper portions of fins 52 in the n-type region 50N and in the p-type region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process, such as one of the epitaxial growth processes described in detail below. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins 52. For example, if the substrate 50 comprises silicon, the homoepitaxial structures may also substantially comprise silicon. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. For example, if the substrate 50 comprises silicon, the heteroepitaxial structures may substantially comprise a different semiconductor material, such as silicon germanium. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., an NMOS region) different from the material in p-type region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not specifically illustrated) may be formed in the fins 52 and/or the substrate 50. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist and/or other masks (not specifically illustrated). For example, a photoresist may be formed over the fins 52 and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the p-type region 50P, a photoresist is formed over the fins 52 and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins 52 may be in situ doped during growth, which may obviate the implantations, although in situ and implantation doping may be used together.

Figure 7:
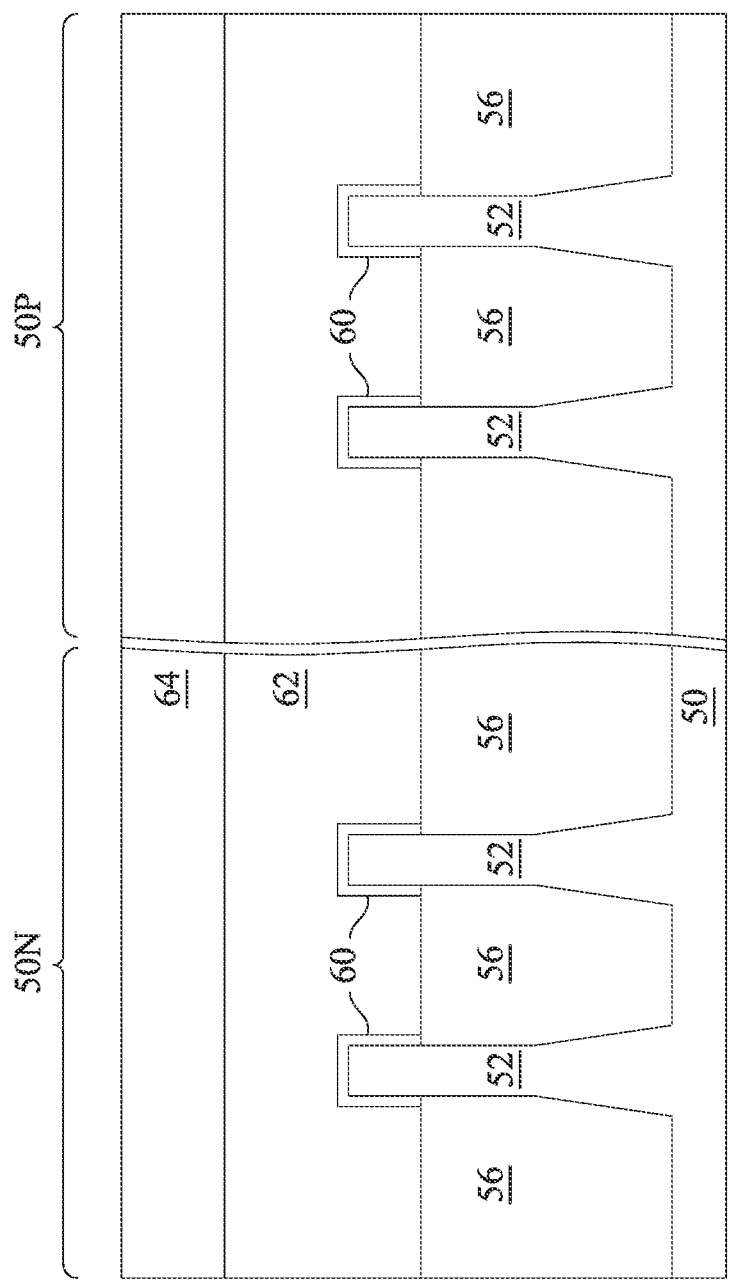

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation regions, for example, the STI regions 56 and/or the dummy dielectric layer 60. The mask layer 64 may include one or more layers of, for example, silicon nitride, silicon oxynitride, or the like. In this example, a single dummy gate layer 62 and a single mask layer 64 are formed across the n-type region 50N and the p-type region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending over the STI regions 56 and between the dummy gate layer 62 and the STI regions 56.

FIGS. 8A through 10D and 23A through 28B illustrate various additional steps in the manufacturing of embodiment devices. FIGS. 8A through 10D and 23A through 28B illustrate features in either of the n-type region 50N and the p-type region 50P. For example, the structures illustrated in FIGS. 8A through 10D and 23A through 28B may be applicable to both the n-type region 50N and the p-type region 50P. Differences (if any) in the structures of the n-type region 50N and the p-type region 50P are described in the text accompanying each figure.

Figure 8B:
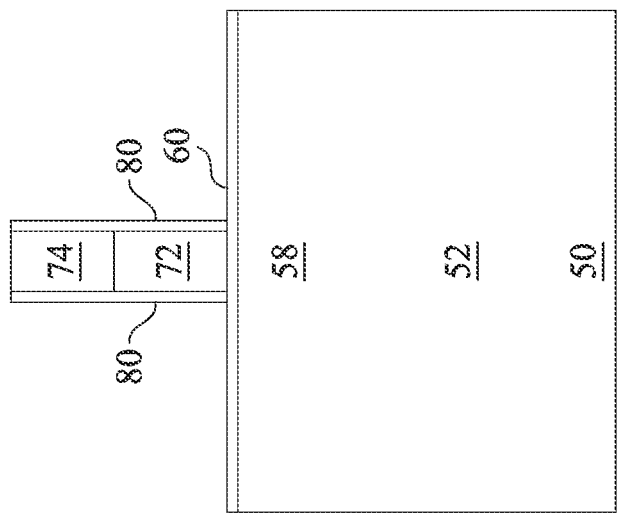
Figure 8A:
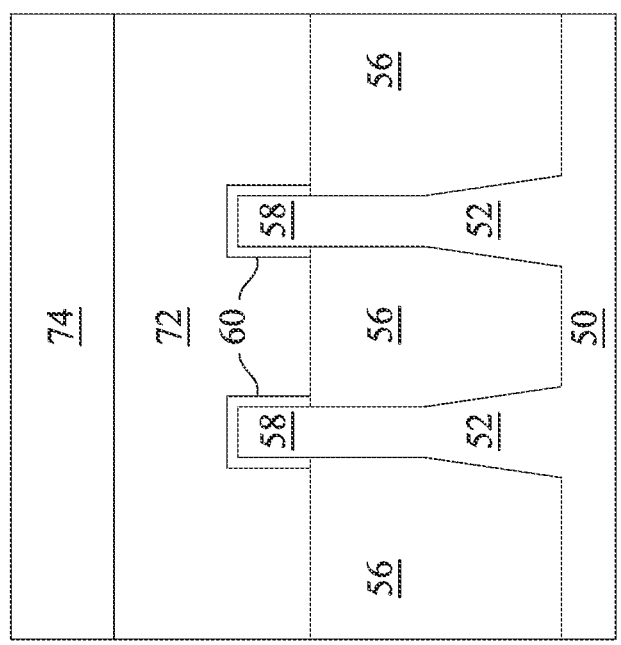

In FIGS. 8A and 8B, the mask layer 64 (see FIG. 7) may be patterned using acceptable photolithography and etching techniques to form masks 74. The pattern of the masks 74 then may be transferred to the dummy gate layer 62. In some embodiments (not specifically illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not specifically illustrated) may be performed. In the embodiments with different device types, similar to the implants discussed above in FIG. 6, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 9B:
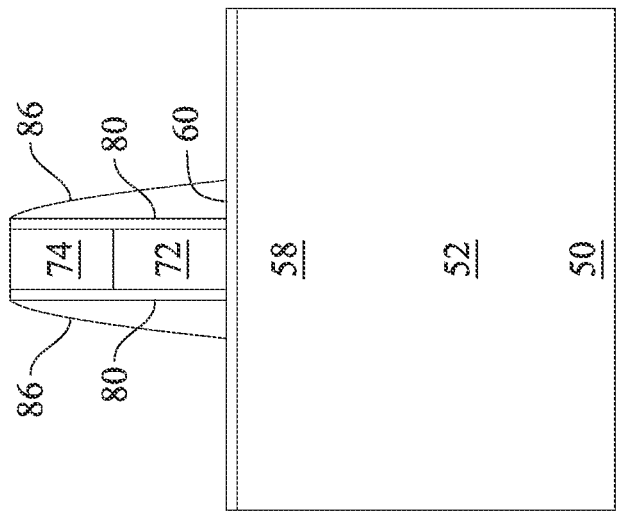
Figure 9A:
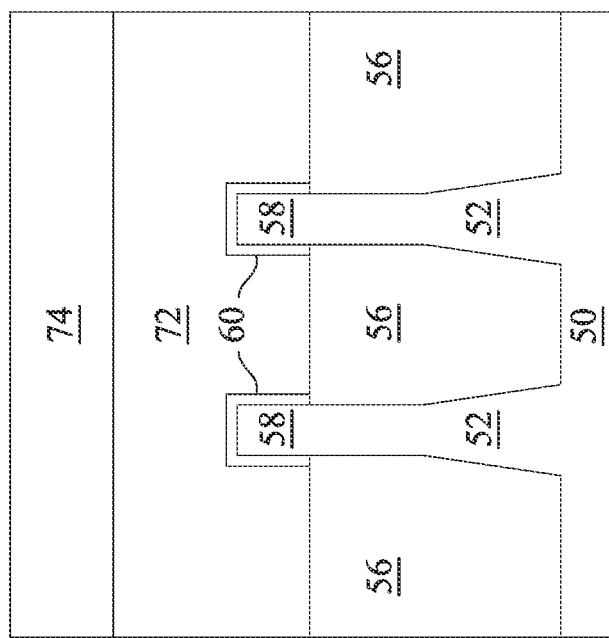

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers), spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 10B:
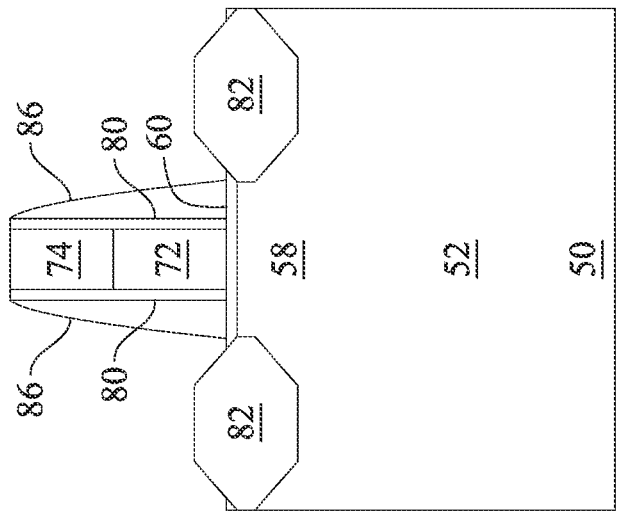
Figure 10A:
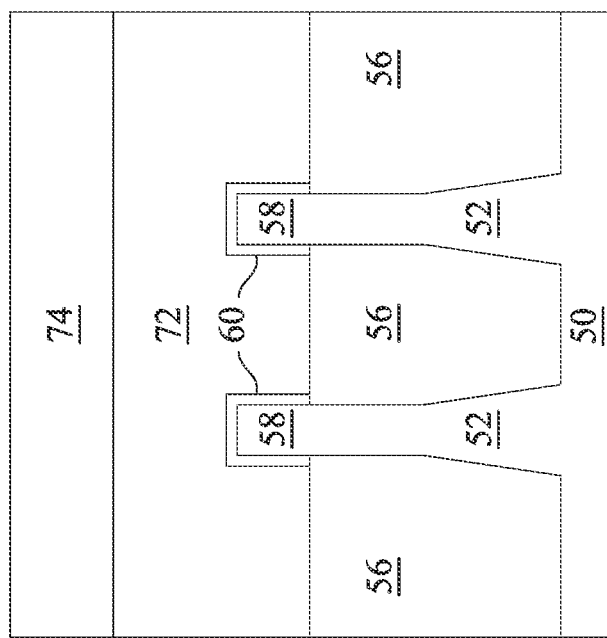
Figure 10D:
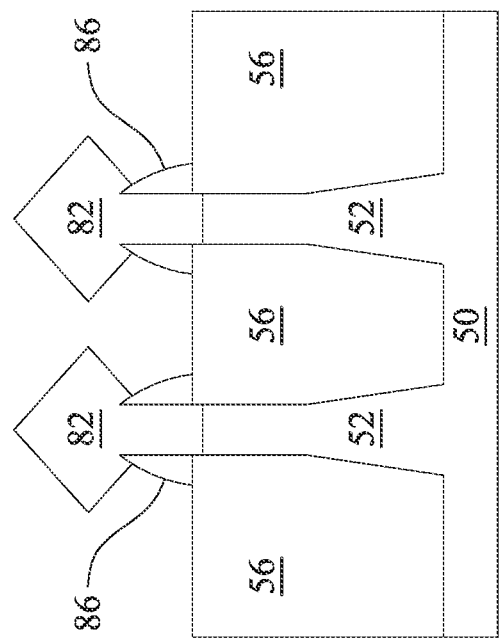
Figure 10C:
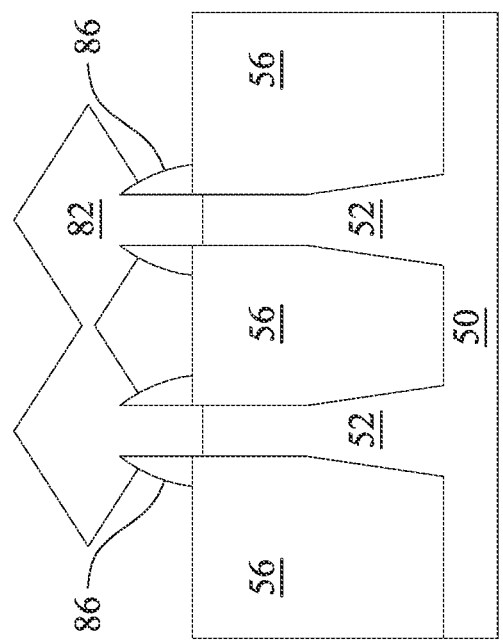

In FIGS. 10A and 10B epitaxial source/drain regions 82 are formed in the fins 52. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs. A material of the epitaxial source/drain regions 82 may be selected to exert stress in the respective channel regions 58, thereby improving performance.

The epitaxial source/drain regions 82 in the n-type region 50N may be formed by masking the p-type region 50P and etching source/drain regions of the fins 52 in the n-type region 50N to form recesses in the fins 52. Then, the epitaxial source/drain regions 82 in the n-type region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the n-type region 50N may include materials exerting a tensile strain in the channel region 58, such as silicon, silicon carbide, phosphorous doped silicon carbide, silicon phosphide, or the like. The epitaxial source/drain regions 82 in the n-type region 50N may have surfaces raised from respective surfaces of the fins 52 and may have facets.

The epitaxial source/drain regions 82 in the p-type region 50P may be formed by masking the n-type region 50N and etching source/drain regions of the fins 52 in the p-type region 50P to form recesses in the fins 52. Then, the epitaxial source/drain regions 82 in the p-type region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the p-type region 50P may comprise materials exerting a compressive strain in the channel region 58, such as silicon-germanium, boron doped silicon-germanium, germanium, germanium tin, or the like. The epitaxial source/drain regions 82 in the p-type region 50P may have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the n-type region 50N and the p-type region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated by FIG. 10C. In other embodiments, adjacent source/drain regions 82 remain separated after the epitaxy process is completed as illustrated by FIG. 10D. In the embodiments illustrated in FIGS. 10C and 10D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figure 12:
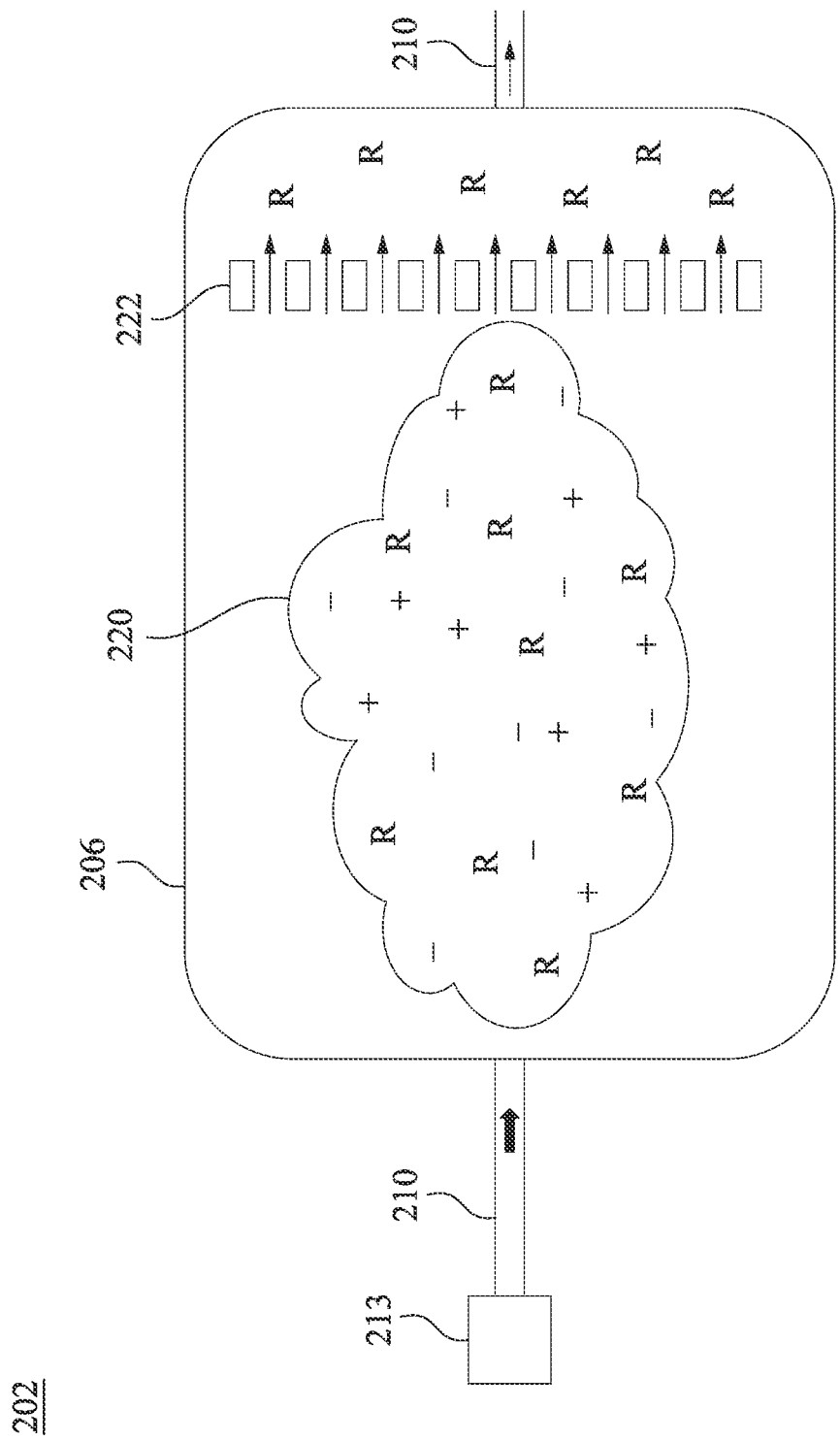

In FIGS. 11-12 illustrate a system which may be used in the formation of the epitaxial source/drain regions 82. In an embodiment the epitaxial source/drain regions 82 may comprise growing, for example, silicon or silicon germanium in the n-type region 50N and/or the p-type region 50P. The epitaxial growth processes may include one or more cleaning steps, growth steps, treatment steps, and etching steps.

In FIG. 11, a processing system 202 may be used to form the epitaxial source/drain regions 82 over the fins 52 on the wafer 10. As illustrated, the processing system 202 may comprise a plurality of precursor delivery systems (e.g., plasma precursor delivery systems 203 and deposition precursor delivery systems 204), a remote plasma chamber 206, a deposition chamber 208, as well as a manifold 210 comprising a system of conduits with valves and control systems to coordinate the delivery of precursors, plasma, and inert gases to the remote plasma chamber 206 and/or the deposition chamber 208. The deposition chamber 208 may also be referred to as a reaction chamber.

Contents of the plasma precursor delivery systems 203 flow through the manifold 210 into the remote plasma chamber 206, and contents of the plasma precursor delivery systems 203 flow through the manifold 210 into the deposition chamber 208. Contents of the deposition precursor delivery systems 204 flow through the manifold 210 into the deposition chamber 208 without passing through the remote plasma chamber 206. Each of the plurality of precursor delivery systems (e.g., the plasma precursor delivery system 203 and the deposition precursor delivery system 204) may comprise a gas supply 211 and a flow controller 212. The gas supply 211 may be a vessel, such as a gas storage tank, that is located either locally to the deposition chamber 208 or located remotely from the deposition chamber 208. In another embodiment, the gas supply 211 may be a facility that independently prepares and delivers its corresponding precursor to the corresponding flow controller. Any suitable source for the precursor may be utilized as the gas supply 211, and all such sources are fully intended to be included within the scope of the embodiments.

After the gas supply 211 supplies the desired precursor to the corresponding flow controller 212, that flow controller 212 may be utilized to control the flow of the precursor to a corresponding precursor gas controller, such as a plasma precursor gas controller 213 and a deposition precursor gas controller 214, and, eventually, to the deposition chamber 208, thereby also helping to control the pressure within the deposition chamber 208. Each flow controller 212 may be, for example, a proportional valve, a modulating valve, a needle valve, a pressure regulator, a mass flow controller, combinations of these, or the like. However, any suitable method for controlling and regulating the flow of the precursor may be utilized, and all such components and methods are fully intended to be included within the scope of the embodiments.

The plasma precursor delivery systems 203 and the deposition precursor delivery systems 204 may have nearly identical components or have variations of the components described above. For example, any type of suitable precursor delivery system, with any type and number of individual components identical to or different from any of the other precursor delivery systems within the processing system 202, may alternatively be utilized. All such precursor delivery systems are fully intended to be included within the scope of the embodiments for either the plasma precursor delivery system 203 or the deposition precursor delivery system 204.

As stated above, each of the deposition precursor delivery systems 204 may supply precursors to the deposition precursor gas controller 214 through the manifold 210. The deposition precursor gas controller 214 connects and isolates the deposition precursor delivery systems 204 from the deposition chamber 208 in order to deliver the desired precursors at the desired times. The deposition precursor gas controller 214 may include such devices as valves, flow meters, sensors, and the like to control the delivery rates of the precursors, and may be controlled by instructions received from a control unit (not specifically illustrated). The control unit may coordinate with both the plasma precursor gas controller 213 for the plasma precursor delivery systems 203 and the deposition precursor gas controller 214 for the deposition precursor delivery systems 204.

The deposition precursor gas controller 214, upon receiving instructions from the control unit, may open and close valves so as to connect one or more of the deposition precursor delivery systems 204 to the deposition chamber 208 and direct a desired precursor(s) through the manifold 210 into the deposition chamber 208. A gas distribution plate 216 may be utilized to disperse the chosen precursor(s) into the deposition chamber 208 and may be designed to evenly disperse the precursor(s) in order to minimize undesired process conditions that may arise from uneven dispersal. The deposition chamber 208 may further comprise a pedestal 218 on which the workpiece rests during processing.

As stated above, each of the plasma precursor delivery systems 203 may supply precursors to the plasma precursor gas controller 213 through the manifold 210. The plasma precursor gas controller 213 connects and isolates the plasma precursor delivery systems 203 from the remote plasma chamber 206 in order to deliver the desired precursors at the desired times. The plasma precursor gas controller 213 may include such devices as valves, flow meters, sensors, and the like to control the delivery rates of the precursors, and may be controlled by instructions received from the control unit (again, not specifically illustrated). As stated above, the control unit may coordinate with both the plasma precursor gas controller 213 for the plasma precursor delivery systems 203 and the deposition precursor gas controller 214 for the deposition precursor delivery systems 204.

The plasma precursor gas controller 213, upon receiving instructions from the control unit, may open and close valves so as to connect one or more of the plasma precursor delivery systems 203 to the remote plasma chamber 206 and direct a desired precursor through the manifold 210 into the remote plasma chamber 206.

The remote plasma chamber 206 further controls the flow of the precursors into the manifold 210 to the deposition chamber 208. The control unit discussed above may control the flow of these precursors similarly to how the control unit coordinates the deposition precursor gas controller 214 that controls the flow of the precursors from the deposition precursor delivery systems 204 to the deposition chamber 208. For example, the remote plasma chamber 206, upon receiving instructions from the control unit, may open and close valves so as to connect the remote plasma chamber 206 to the deposition chamber 208 and direct the precursors (substantially excluding any ions) through the manifold 210 into the deposition chamber 208.

Still referring to FIG. 11, the remote plasma chamber 206 functions to convert some or all of the precursor(s) to a plasma 220 (see FIG. 12). For example, a hydrogen gas ($H_2$) precursor provided from its corresponding plasma precursor delivery system 203 may be substantially converted to hydrogen radicals (H*). However, not all of the hydrogen gas may convert to hydrogen radicals. For example, hydrogen ions, such as hydrogen cations (H+) and hydrogen anions (H−), may also be formed in the conversion process. Hydrogen ions that reach the deposition chamber 208 would be reactive with various layers of the wafer 10 in the deposition chamber 208 and potentially cause undesired reactions. As such, the remote plasma chamber 206 may comprise a selective modulation device 222 (e.g., an ion filter), which attracts ions and prevents the ions from exiting the remote plasma chamber 206 and reaching a portion of the manifold 210 that eventually leads to the deposition chamber 208. Within the remote plasma chamber 206, other precursors, such as inert gases like argon (Ar) and helium (He) may remain in their standard monatomic forms. Those inert gases will not be substantially attracted by the ion filter and, therefore, will be allowed to proceed to the manifold 210 and ultimately delivered to the deposition chamber 208. In some embodiments, inert gases may begin within one of the deposition precursor delivery systems 204 and pass through the manifold 210 to the deposition chamber 208 without passing through the remote plasma chamber 206.

In FIG. 12, the remote plasma chamber 206 further includes the selective modulation device 222 (e.g., an ion filter), which may comprise an electrically charged grating that acts as a barrier to the movement of charged ions "+"/"−" from a plasma while allowing uncharged plasma "R" (e.g., radicals) to pass through the selective modulation device 222. In some embodiments, the selective modulation device 222 can prevent the charged plasma ions (e.g., positively charged ions "+" or negatively charged ions "−") from passing by either repelling the charged plasma ions or else by attracting the charged plasma ions. However, any suitable device that can separate radicals from a plasma may be utilized. In embodiments in which inert gases (e.g., Ar and/or He) pass through the remote plasma chamber 206, the selective modulation device 222 allows the inert gases to pass through and eventually into the manifold 210.

Once the plasma 220 has been generated, the selective modulation device 222 allows the radical components "R" to pass through the selective modulation device 222 into the manifold 210 and eventually into the deposition chamber 208, where the wafer 10 is located. Additionally, the selective modulation device 222 substantially prevents the movement of the positive ions "+" and also the negative ions "−" from entering the manifold 210 and the deposition chamber 208. In effect, the selective modulation device 222 is utilized to filter the positive ions "+" and the negative ions "−" from the plasma 220, thereby allowing only the radical components "R" to be used in a hydrogen plasma treatment described in greater detail below.

Figure 13A:
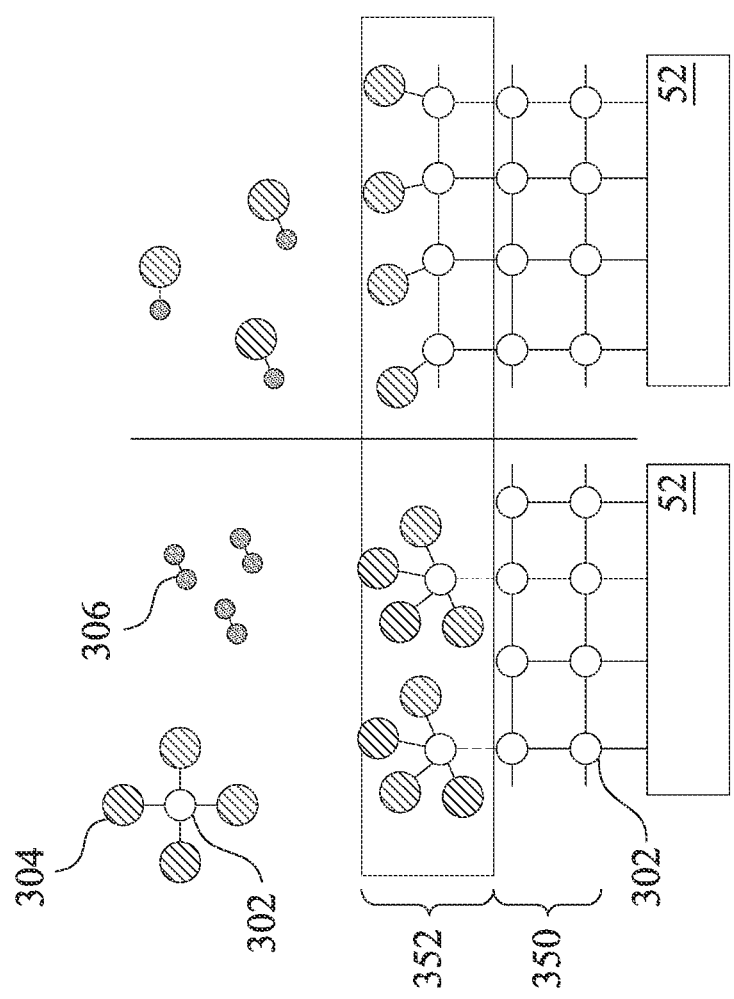
FIGS. 13A, 13B, 13C, 14, and 15 illustrate chemical reactions, in accordance with some embodiments.
Figure 13B:
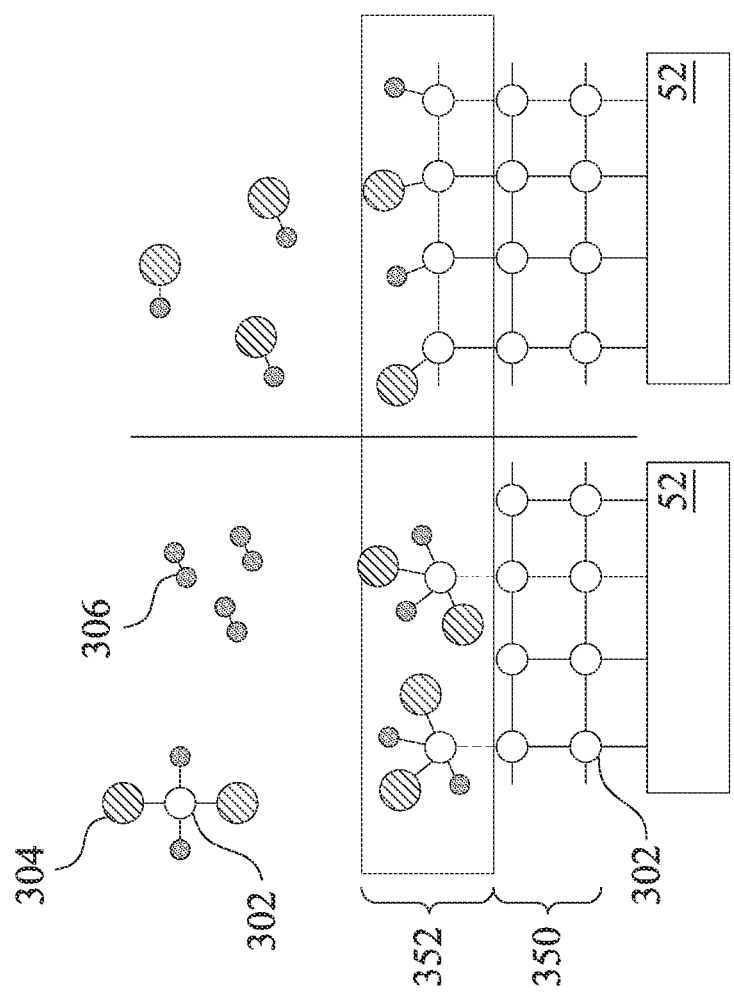
Figure 13C:
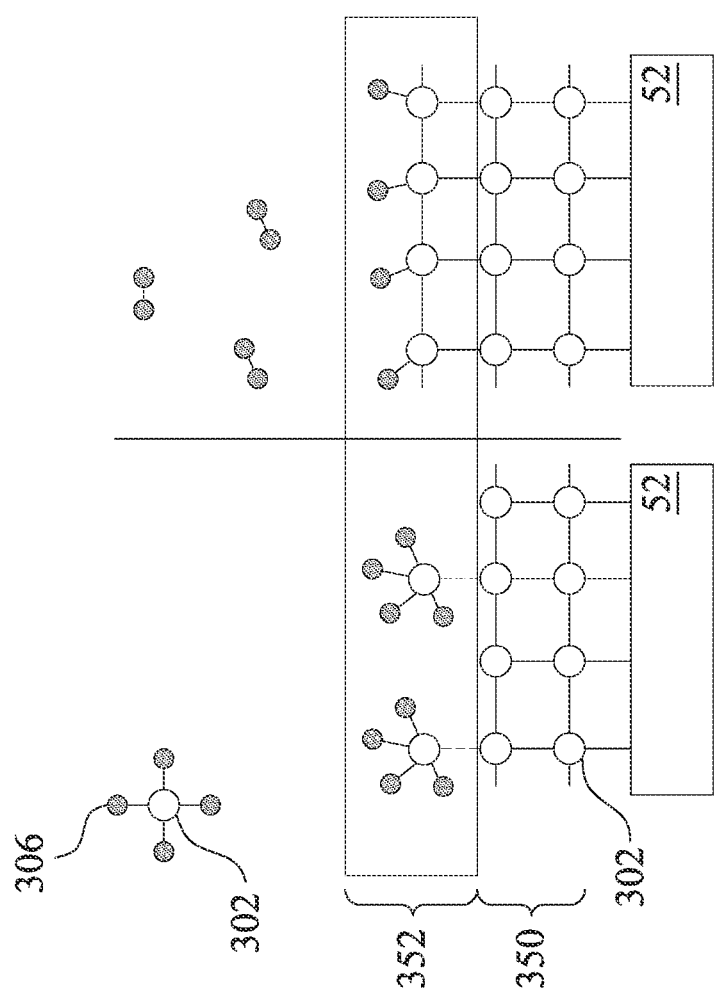

In FIGS. 13A-C, an epitaxial growth process of a semiconductor material, such as silicon, may occur through a series of chemical reactions to form the epitaxial source/drain region 82 over the fin 52. In some embodiments, prior to the initiation of the epitaxial growth process, a pre-cleaning process may be performed to prepare the fins 52 for the epitaxial growth process. For example, the pre-cleaning process may occur through the processing system 202 and in situ while the wafer 10 is inside the deposition chamber 208. Cleaning precursors may flow initially from the deposition precursor delivery systems 204 through the manifold 210 into the deposition chamber 208 and over the wafer 10. The cleaning precursors may comprise dilute hydrofluoric acid (DHF), the like, any combinations thereof, or any suitable materials.

As stated above, the fins 52 may comprise, for example, silicon or silicon germanium. Initially, as the epitaxial growth begins, a growing layer forms over the fin 52 to form a surface layer 352. The surface layer 352 may be partially aligned with a crystalline structure of the underlying fin 52 while also having some portions not closely aligned with the crystalline structure. As the epitaxial growth continues, portions of the surface layer 352 closer to the underlying fin 52 may start to more closely align with the cyrstalline structure as a newer growing layer forms overhead. In which case, the aligned portions of the growing layer become an intermediate layer 350, and the newer growing layer becomes the surface layer 352. Similarly as stated above, the surface layer 352 may be partially aligned with the crystalline structure of the fin 52 as well as the intermediate layer 350.

During the epitaxial growth process, the surface layer 352 forms over the fin 52 and over the intermediate layer 350 if present. For the sake of simplicity, the following description will assume the presence of at least part of an intermediate layer 350. As described above, the intermediate layer 350 may substantially follow the crystalline structure of the underlying fin 52, while the surface layer 352 may have a less identifiable lattice structure or none at all. Note that the left portions of FIGS. 13A-C illustrate an early intermediate stage of the surface layer 352 growth process including the precursors, while the right portions of the figures illustrate a later intermediate stage of the surface layer 352 growth process as well as some of the products—the products including the growing surface layer 352 and gaseous byproducts. As the epitaxial growth process continues, the intermediate layer 350 increases in thickness, and the surface layer 352 is an exposed upper portion of the epitaxy that is in the process of being formed.

As discussed above in connection with FIG. 11, the deposition precursors may initially flow from the deposition precursor delivery systems 204 through the manifold 210 and into the deposition chamber 208. The deposition precursors may comprise a first deposition precursor and, optionally, a second deposition precursor and/or an etching precursor. In some embodiments, the first deposition precursor may comprise silane ($SiH_4$), chlorosilane ($SiClH_3$), dichlorosilane ($SiCl_2H_2$), trichlorosilane ($SiCl_3H$), silicon tetrachloride ($SiCl_4$), the like, combinations thereof, or any suitable compounds. The first deposition precursor may be flowed into the deposition chamber 208 at a rate of between about 0 sccm (standard cubic centimeters per minute) and about 2000 sccm. The deposition chamber 208 may be maintained at temperatures of between about 500° C. and about 850° C. and at a pressure of between about 3 Torr and about 500 Torr.

The second deposition precursor, if used, may comprise one or more of the materials listed above for the first deposition precursor and/or hydrogen gas ($H_2$), the like, any combinations thereof, or any suitable materials. The second deposition precursor may improve the reaction yield during the epitaxial growth process and may provide a reactant to facilitate removal of chlorine from any one of the first and second deposition precursors. The second deposition precursor may be flowed into the deposition chamber 208 at a rate of up to about 50 slm (standard liters per minute). In some embodiments, the epitaxial growth process may proceed as one or more of the first and second deposition precursors adsorbs to the surface layer 352, such as a silicon atom 302, as illustrated. The reaction may then kick off one or more of the non-silicon atoms (e.g., chlorine 304 or hydrogen 306) from the surface layer 352. In addition, the kicked off non-silicon atom may be picked up by a nearby ambient atom or molecule. The attached silicon atom 302 and remaining portions of the first or second deposition precursor molecule then become part of the growing surface layer 352.

The etching precursor (not specifically illustrated), if used, may facilitate preferential growth over the fin 52 and intermediate layer 350 and provide additional control over the epitaxial growth process, including control over the growth rate and shaping of the epitaxy during growth. For example, in some embodiments the etching precursor may preferentially etch a surface with one crystalline structure of the material over another surface with a different crystalline structure. As such, the etching precursor may preferentially etch in a particular direction (e.g., horizontally) while still allowing growth in a separate direction (e.g., vertically). Additionally, although the epitaxial growth process selectively grows over the fin 52, some growth may still occur over other exposed layers (e.g., dummy dielectric layer 60, gate seal spacers 80, and/or gate spacers 86) on the wafer 10. As such, the etching precursor may remove most or all of the smaller portions of epitaxial growth over those other exposed layers as well as relatively fractional amounts of the greater epitaxial growth over the fins 52. The etching precursor may comprise chlorine gas ($Cl_2$), carbon tetrafluoride ($CF_4$), trifluoromethane ($CHF_3$), fluoromethane ($CH_3F$), hydrogen bromide (HBr), the like, any combinations thereof, or any suitable materials. The etching precursor may be flowed into the deposition chamber 208 at a rate of between about 10 sccm and about 2000 sccm.

Referring to FIG. 13A, in some embodiments, first and second deposition precursors, such as silicon tetrachloride (comprising silicon atoms 302 and chlorine atoms 304) and hydrogen gas (comprising hydrogen atoms 306) may be flowed into the deposition chamber 208 and over the fin 52, the intermediate layer 350, and the surface layer 352. The reaction products substantially include a silicon deposition forming the surface layer 352.

Referring to FIG. 13B, in other embodiments, first and second deposition precursors, such as dichlorosilane (comprising silicon atoms 302, chlorine atoms 304, and hydrogen atoms 306) and hydrogen gas, may be flowed into the deposition chamber 208 and over the fin 52, the intermediate layer 350, and the surface layer 352. The reaction products substantially include a silicon deposition forming the surface layer 352 substantially follows the crystallinearity of the underlying layers (e.g., the fin 52 and the intermediate layer 350) and hydrogen chloride gas.

Referring to FIG. 13C, in other embodiments, deposition precursors, such as silane (comprising silicon atoms 302 and hydrogen atoms 306), may be flowed into the deposition chamber 208 and over the fin 52, the intermediate layer 350, and the surface layer 352. The reaction products substantially include a silicon deposition that substantially follows the crystallinearity of the underlying silicon layer and hydrogen gas.

Figure 14:
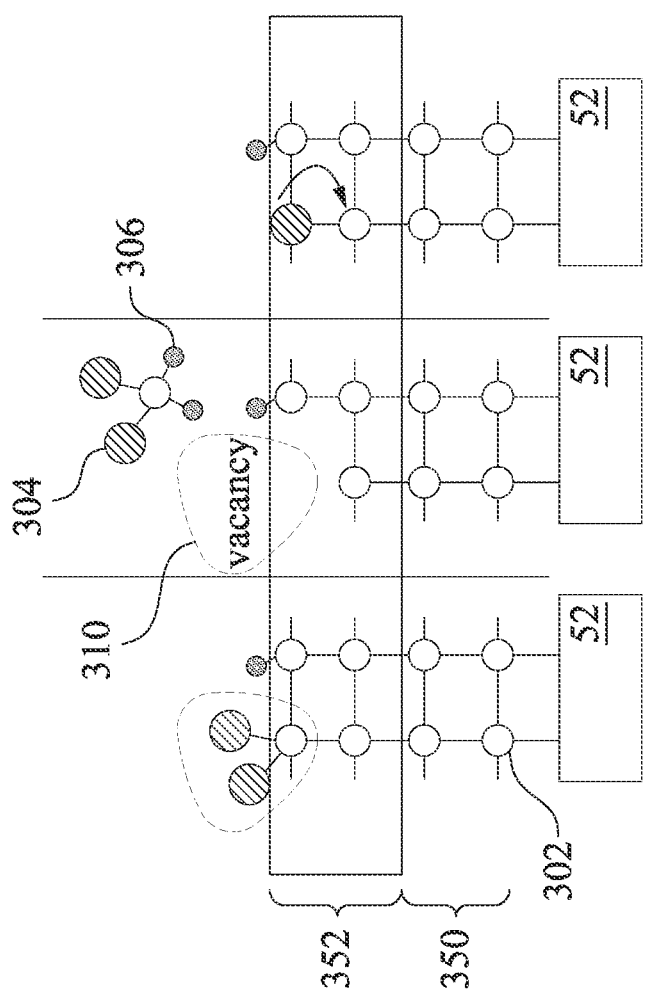

In FIG. 14, continuing, for example, from the process described above in connection with FIG. 13B, secondary reactions may occur in the surface layer 352 during the epitaxial growth process discussed above. For example, as shown in the left portion of the figure, molecular structures along the surface layer 352, such as —$SiCl_2$ or the like, may desorb from the crystalline lattice and bond with ambient hydrogen atoms to form a gaseous compound, such as dichlorosilane. As a result of the desorption, in some cases, a vacancy 310 may be formed in the crystalline lattice as illustrated in the middle portion of the figure. If chlorine is nearby, such as an ambient chlorine atom 304, chlorine gas (comprising chlorine atoms 304), or hydrogen chloride (comprising chlorine atoms 304 and hydrogen atoms 306), one of the chlorine atoms 304 may fill the vacancy 310, as illustrated in the right portion of the figure. The chlorine atoms 304 that fill various vacancies 310 will terminate those silicon nucleation sites and, therefore, inhibit or slow down deposition of silicon during the epitaxial growth process by preventing epitaxial growth in at that site. In addition, the crystallinearity may be disrupted by any chlorine atoms 304 in the surface layer 352.

Figure 15:
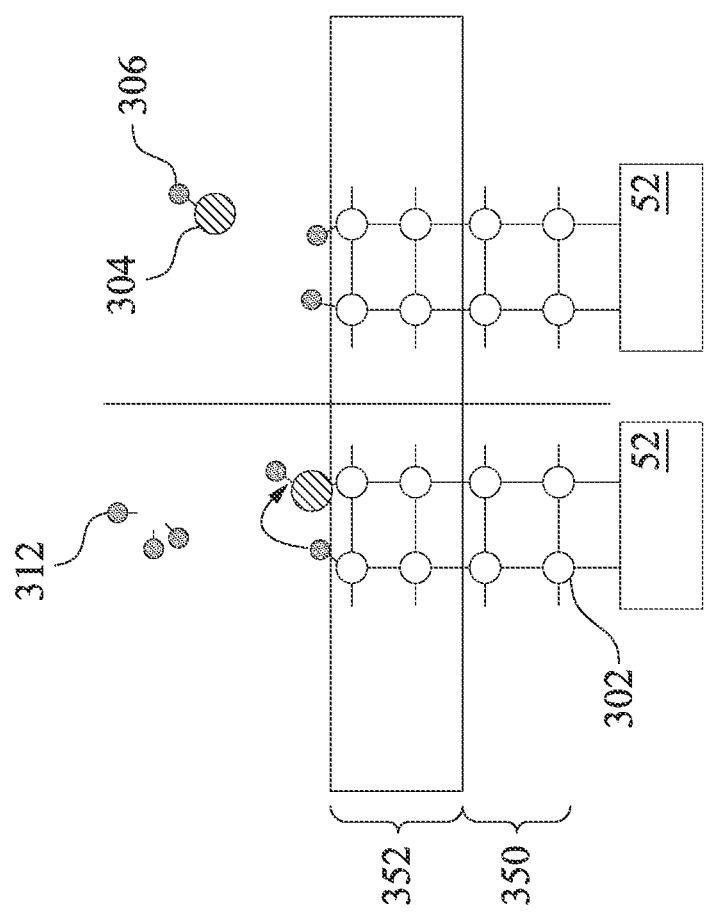
Figure 16:
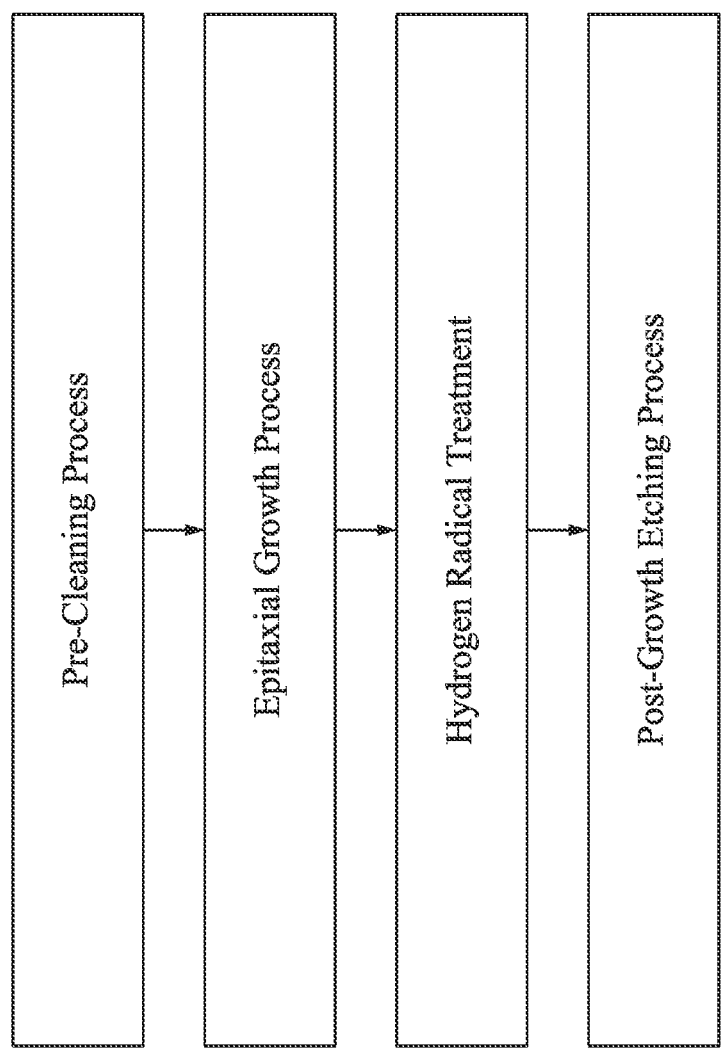
FIGS. 16-19 are process flows, in accordance with some embodiments.

In FIG. 15, a hydrogen radical treatment may be performed to remove chlorine atoms 304 that may be attached to, for example, silicon atoms 302 that have been deposited as part of the growing epitaxial layer. The hydrogen radical treatment may be performed such that the shape of the growing epitaxial layer remains the same or substantially the same before and after the hydrogen radical treatment.

As discussed above, during the hydrogen radical treatment, hydrogen gas in one of the plasma precursor delivery systems 203 flows through the manifold 210 to the remote plasma chamber 206 to be converted to hydrogen radicals 312, which then flow through the manifold 210 to the deposition chamber 208. After the epitaxial growth process described above, chlorine atoms 304 may be bonded or adsorbed along an upper portion of the surface layer 352 as illustrated in FIG. 15 or embedded within the lattice structure of the surface layer 352 or the fin 52 as illustrated in the right portion of FIG. 14. As discussed in connection with the possible secondary reactions, those chlorine atoms 304 may contribute to molecular structures that desorb from the crystalline lattice, such as —$SiCl_2$ groups. However, the hydrogen radical treatment allows the hydrogen radicals 312 to bond with those chlorine atoms 304 to facilitate desorption of only hydrogen chloride from the crystalline lattice rather than desorption of a molecular structure comprising a silicon atom 302. The desorbed chlorine atoms 304 are then typically replaced by ambient hydrogen atoms 306, which may include hydrogen radicals 312 and/or hydrogen ions (not labeled distinctively from other hydrogen atoms 306/312). In cases in which the chlorine atom 304 desorbs from the lattice structure, the surface layer 352 may shift to better align this portion with the rest of the lattice structure in the surface layer 352 and the intermediate layer 350.

The hydrogen radical treatment includes flowing hydrogen radicals 312 and carrier gases, such as helium and/or argon, into the deposition chamber 208. The hydrogen radicals may be flowed at a rate of up to about 10 slm. The carrier gases may be flowed at a rate of between about 50 sccm and about 10 slm. The deposition chamber 208 may be maintained at temperatures of between about 10° C. and about 400° C. and at pressures of between about 0.1 Torr and about 10 Torr for a duration of up to about 50 seconds.

When one or more of the deposition precursors include chlorine atoms 304, the epitaxial growth process may introduce chlorine atoms 304 into the surface layer 352, whether through the main reactions or through the secondary reactions, as discussed above. The hydrogen radical treatment then acts to decrease the concentration of the chlorine atoms 304 in the surface layer 352 or even the epitaxially grown portion of the intermediate layer 350. Following the epitaxial growth process and before the hydrogen radical treatment, the surface layer 352 may comprise a concentration of chlorine atoms 304 greater than about $1\times10^{18}$ atoms/$cm^3$. After the hydrogen radical treatment, the surface layer 352 may comprise a concentration of chlorine atoms 304 less than about $1\times10^{18}$ atoms/$cm^3$.

Following the epitaxial growth process and the hydrogen radical treatment, a post-growth etching process may be performed to further shape the epitaxial region to fit a desired shape and critical dimensions. The post-growth etching process may comprise a wet or dry etch, which may be isotropic or anisotropic. For example, the etchants may comprise hydrogen chloride (HCl), the like, any combinations thereof, or any suitable etchants.

In FIGS. 16-19, the above described steps may be performed in a variety of orders. For example, looking first at FIG. 16, formation of the epitaxial source/drain regions 82 may proceed with the pre-cleaning process, the epitaxial growth process, the hydrogen radical treatment, and the post-growth etching process. In those embodiments, the epitaxial growth process is performed to completion, and the subsequent hydrogen radical treatment and post-growth etching process bring the epitaxy to final form. As a result, the final form of the epitaxy may comprise a gradient in the chlorine concentration such that more chlorine atoms are removed from the surface and upper portions of the epitaxy while more chlorine atoms remain in lower portions.

Figure 17:
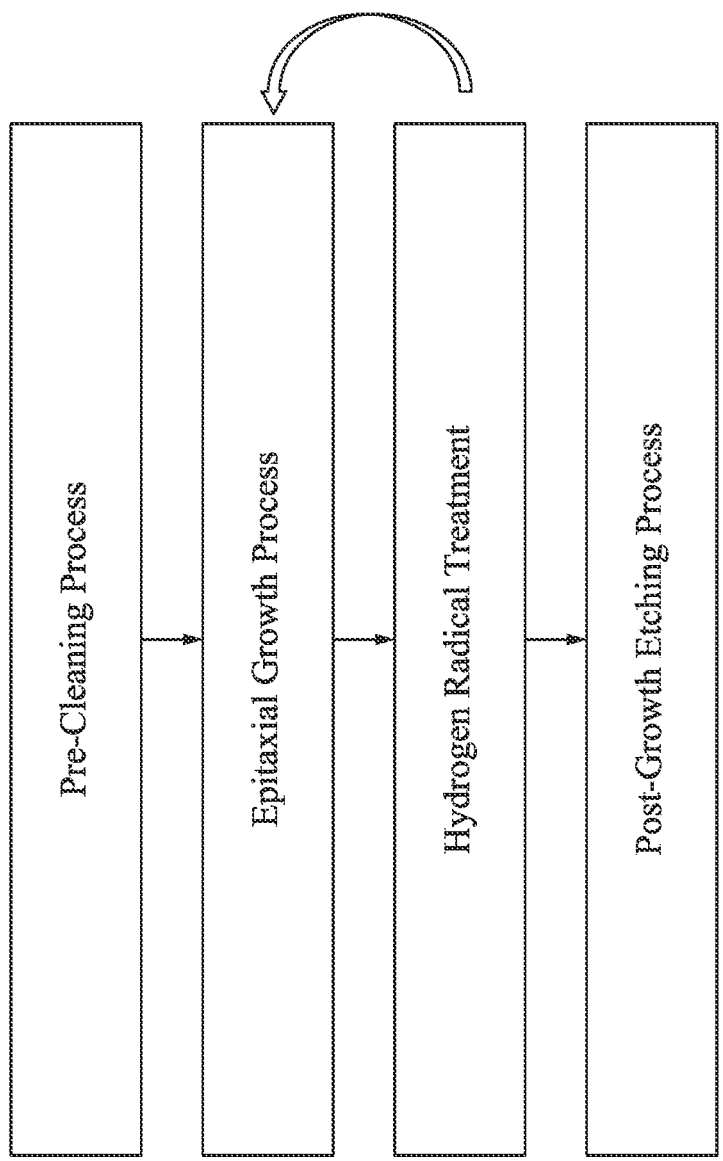

Looking at another embodiment illustrated in FIG. 17, formation of the epitaxial source/drain regions 82 may proceed with the pre-cleaning process, the epitaxial growth process, the hydrogen radical treatment, one or more additional alternating cycles of the epitaxial growth process and the hydrogen radical treatment, and the post-growth etching process. In those embodiments, each epitaxial growth process may be partial and, therefore, not performed to completion until the very last epitaxial growth process is concluded. As a result, the chlorine concentration in the final form of the epitaxy may be substantially consistent throughout the thickness of the epitaxy because the chlorine atoms may be removed by substantially the same proportion during each cycle of the hydrogen radical treatment. In some embodiments, some of the process parameters described above for each epitaxial growth process cycle and/or each hydrogen radical treatment cycle may be varied during the epitaxial growth process.

In some embodiments, a total number N of epitaxial growth process cycles and a total number N of hydrogen radical treatment cycles may be performed during the process of forming the epitaxial source/drain regions 82. The total number N may be between about 1 and about 9 cycles, such as between about 1 and about 5 cycles. By limiting the total number N to less than 9 cycles, such as between 1 and 5 cycles, the hydrogen radical treatments improve the crystallinearity of the epitaxy (e.g., the epitaxial source/drain regions 82) while reducing or avoiding any changes to the shape of the epitaxy.

The N total cycles may proceed for a predetermined total time T. The predetermined total time T may be selected based, in part, on the design of the epitaxial structure to be formed. For example, the predetermined time T may be up to about 50 seconds for the epitaxial source/drain regions 82. In the case of the total number N being 5 cycles and the predetermined total time T being about 50 seconds, each hydrogen radical treatment cycle may have a duration of up to about 10 seconds. As another example in the case of N being 5 cycles and T being about 50 seconds, a first one to two hydrogen radical treatment cycles may each have a duration of greater than about 10 seconds while the remaining hydrogen radical treatment cycles may each have a duration of less than about 10 seconds. Alternatively, the first one or two hydrogen radical treatment cycles may each have a duration of less than about 10 seconds while the remaining hydrogen radical treatment cycles may each have a duration of greater than about 10 seconds.

Figure 18:
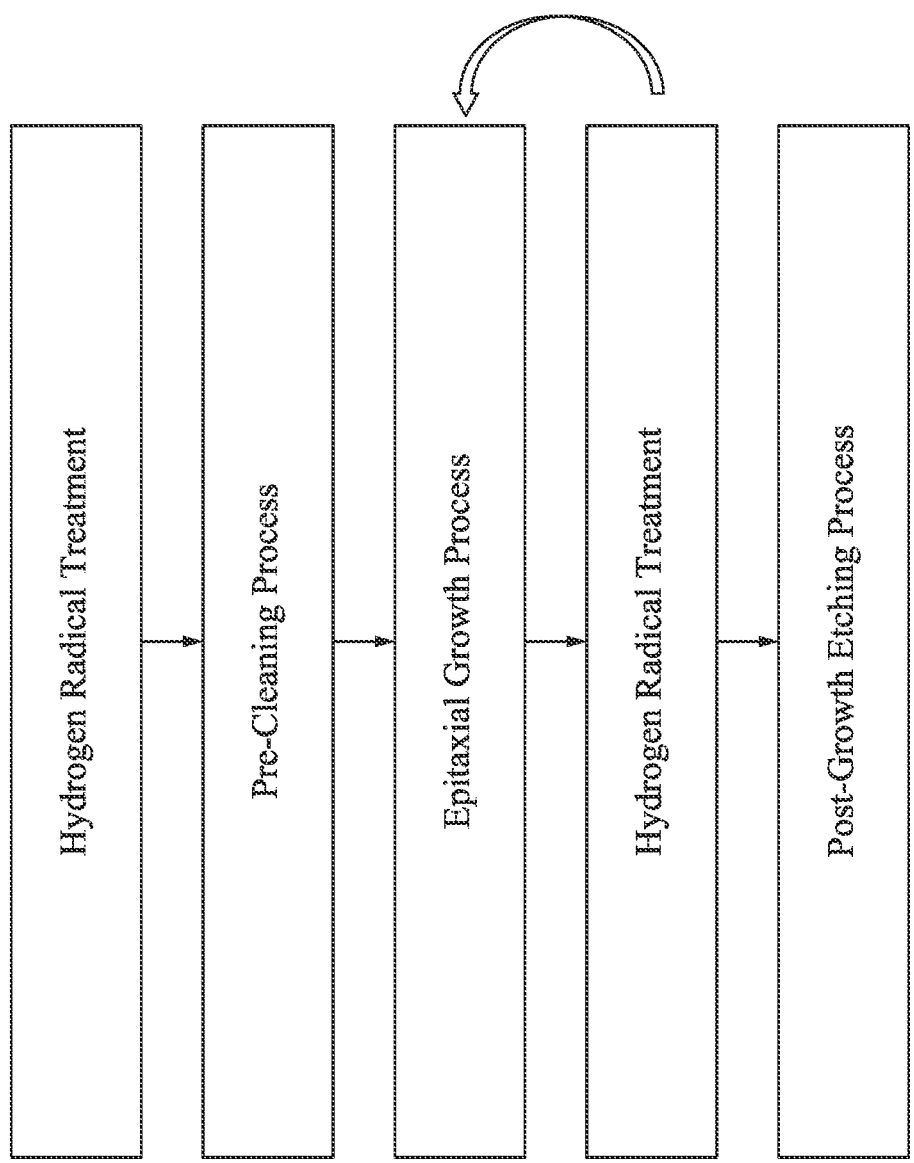

Looking at another example illustrated in FIG. 18, formation of the epitaxial source/drain regions 82 may proceed with an initial hydrogen radical treatment to prepare the fins 52, the pre-cleaning process, the epitaxial growth process, the hydrogen radical treatment, optionally one or more additional cycles of the epitaxial growth process and the hydrogen radical treatment, and the post-growth etching process. Alternatively, the first two steps may be switched such that the pre-cleaning process is performed just prior to the initial hydrogen radical treatment. Performing the initial hydrogen radical treatment before the epitaxial growth process serves the benefit of providing additional control over the epitaxial growth process. In addition, during the epitaxial growth process, chlorine (e.g., —SiCl$_2$ group) is etched away leaving vacancies, interstitial chlorine, or a chlorine-terminated surface, which leads to crystallinearity defects and surface roughness. The subsequent hydrogen radical treatment cycles repair these defects and improve the surface of the epitaxy. In an epitaxial growth process comprising a total number N of epitaxial growth process cycles, a total number N+1 of hydrogen radical treatment cycles will be performed for the total hydrogen radical treatment time of up to about 50 seconds. Similarly as stated above, a total number N+1 of less than or equal to about 6 cycles will improve the crystallinearity of the epitaxy while avoiding or reducing any undesired changes to the shape of the epitaxy.

Figure 19:
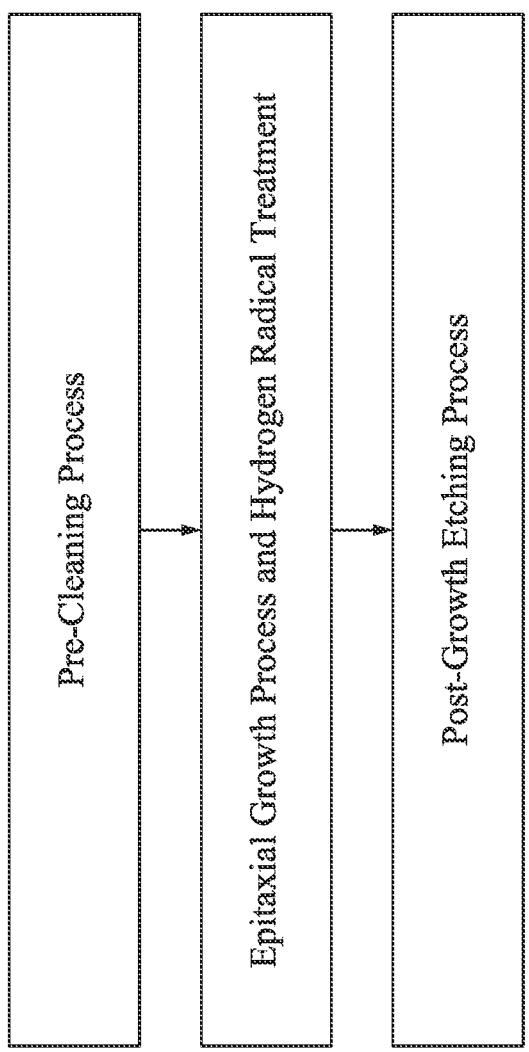

Looking at yet another example illustrated in FIG. 19, formation of the epitaxial source/drain regions 82 may proceed with the pre-cleaning process, a simultaneous epitaxial growth process and hydrogen radical treatment, and the post-growth etching process. In those embodiments, chlorine atoms are quickly removed from the epitaxy throughout formation. As a result, the growth proceeds much more quickly and the crystallinearity may be less robust. For example, the deposition precursors, such as dichlorosilane, may be flowed at a rate of between about 10 sccm and about 2000 sccm, and the hydrogen radicals may be flowed at a rate of between about 10 sccm and about 50 slm. The deposition chamber 208 may be maintained at temperatures of between about 10° C. and about 400° C. and at pressures of between about 0.1 Torr and about 10 Torr.

Figure 20:
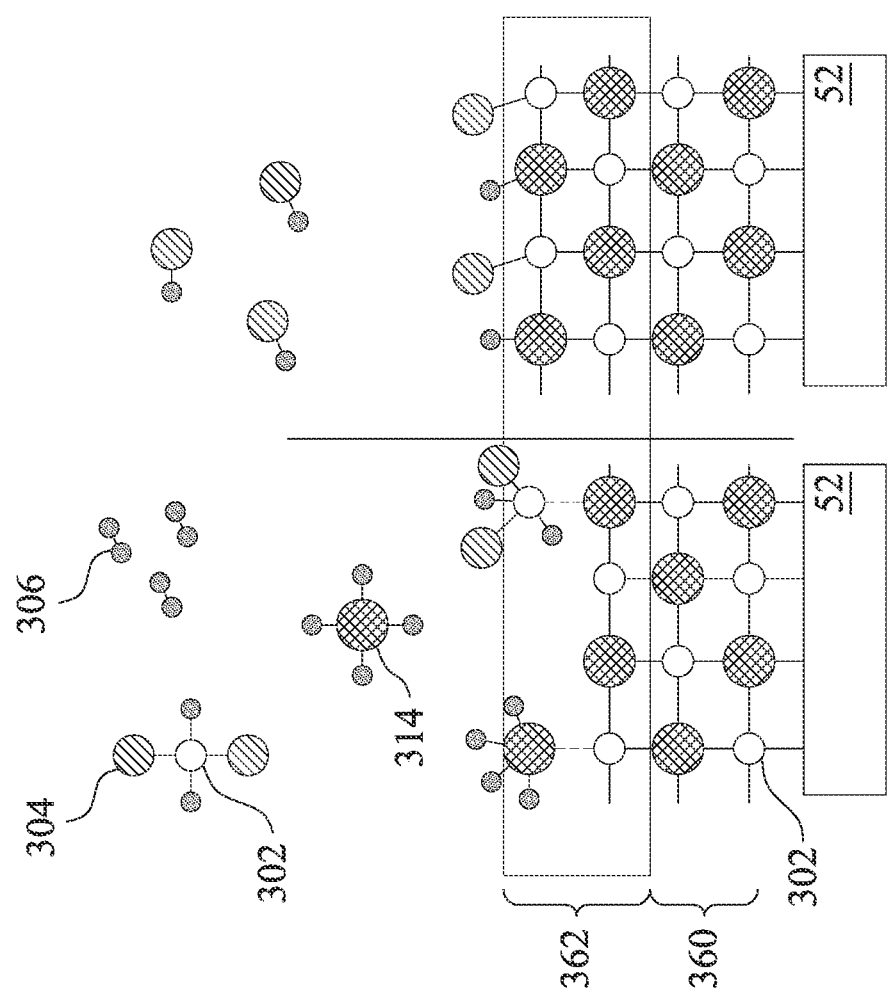
FIGS. 20-22 illustrate chemical reactions, in accordance with some embodiments.

In FIG. 20, in an alternative embodiment, some or all of the epitaxial source/drain regions 82 grown over the fin 52 may be formed to comprise silicon germanium instead of silicon. The formation may be substantially similar to the processes described above with certain differences that will be described in greater detail. For example, the deposition precursors may include one or more of the first deposition precursors discussed above (e.g., a silicon precursor, such as dichlorosilane), one or more of the second deposition precursors discussed above (e.g., hydrogen), and one or more third deposition precursors. The third deposition precursor, such as a germanium containing precursor may include germane (GeH$_4$), the like, or any combinations thereof. As illustrated in the left portion of the figure, the silicon atoms 302 of the first deposition precursor and germanium atoms 314 of the third deposition precursor adsorb to the surface layer 362. And as illustrated in the right portion of the figure, bonds form to integrate the silicon atoms 302 and the germanium atoms 314 with the fin 52.

For the sake of example, formation of the epitaxial source/drain region 82 comprising silicon germanium may proceed with a series of processes as described above in connection with FIG. 17 in which multiple cycles of the epitaxial growth process and the hydrogen radical treatment are alternated until the epitaxial region is fully grown. During the epitaxial growth process of the semiconductor material, a series of chemical reactions form the epitaxial source/drain region 82 over the fin 52. Initially, as the epitaxial growth begins, a growing layer forms over the fin 52 to form a surface layer 362. The surface layer 362 may be partially aligned with a crystalline structure of the underlying fin 52 while also having some portions not closely aligned with the crystalline structure. As the epitaxial growth continues, portions of the surface layer 362 closer to the underlying fin 52 may start to more closely align with the cyrstalline structure as a newer growing layer forms overhead. In which case, the aligned portions of the growing layer become an intermediate layer 360, and the newer growing layer becomes the surface layer 362. Similarly as stated above, the surface layer 362 may be partially aligned with the crystalline structure of the fin 52 as well as the intermediate layer 360.

Figure 21:
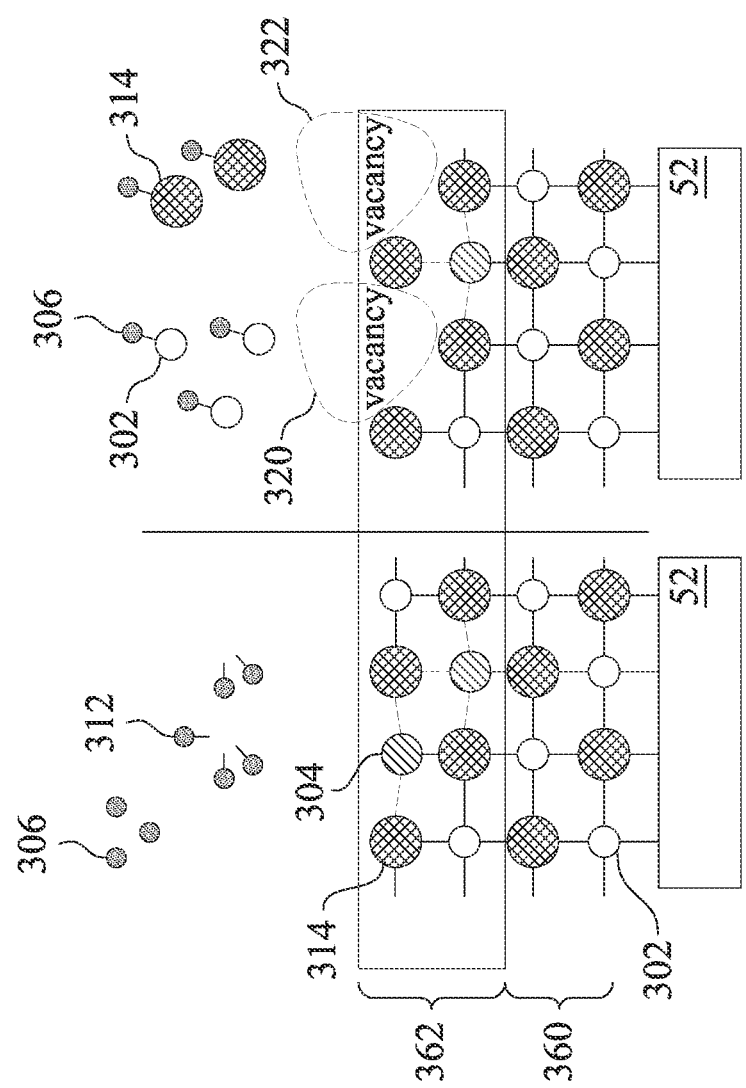

In FIG. 21, the hydrogen radical treatment may be performed on the surface layer 362 in a manner substantially similar to that described above. As described in greater detail above, a benefit of the hydrogen radical treatment is to remove chlorine atoms 304 from the surface layer 362 as described above in connection with FIG. 15 in order to facilitate further growth of the epitaxy, such as during a subsequent epitaxial growth process.

Another consequence of the hydrogen radical treatment is that the hydrogen radicals may also attach to and remove a small number of silicon atoms 302 and germanium atoms 314 from the surface layer 362. Indeed, a similar effect may be observed when forming a silicon epitaxial regions, such as in connection with FIGS. 13A-15 above. However, in the case of forming an epitaxial region comprising a silicon germanium, silicon atoms 302 may be removed at a higher percentage than germanium atoms 314. This may be observed due to hydrogen radicals 312 having a higher selectivity for silicon atoms 302 than for germanium atoms 314, and hydrogen atoms 306 typically have a higher bond dissociation energy with silicon atoms 302 than with germanium atoms 314. As a result, performing the hydrogen radical treatment on a surface layer 362 comprising silicon germanium provides a method for tuning the silicon and germanium concentrations in the surface layer 362 and, ultimately, the epitaxial source/drain region 82. For example, although the hydrogen radicals 312 and the hydrogen atoms 306 will have a higher selectivity and a higher bond dissociation energy with chlorine atoms 304, there will nonetheless be some degree of bonding with and etching of silicon atoms 302 and germanium atoms 314 from the surface layer 362. Due to the preference for silicon atoms 302 over germanium atoms 314, the hydrogen radical treatment and a subsequent cycle of the epitaxial growth process (see FIG. 22) will eventually result in a concentration of the silicon atoms 302 in the SiGe epitaxial layer 362 to decrease and a concentration of the germanium atoms 314 in the SiGe epitaxial layer 362 to increase.

The left portion of FIG. 21 illustrates a portion of the surface layer 362 having proportions of silicon atoms 302 and germanium atoms 314 at about 50% each as well as a chlorine atom 304 composing part of the structure and inhibiting subsequent epitaxial growth and/or the crystalline structure. The right portion of the figure illustrates that the removal of the chlorine atom 304 may result in a vacancy 320 in the surface layer 362. In addition, removal of a silicon atom 302 may result in a vacancy 322 from the surface layer 362, illustrating the slight preference of the hydrogen radical treatment in silicon atoms 302 over germanium atoms 314.

Figure 22:
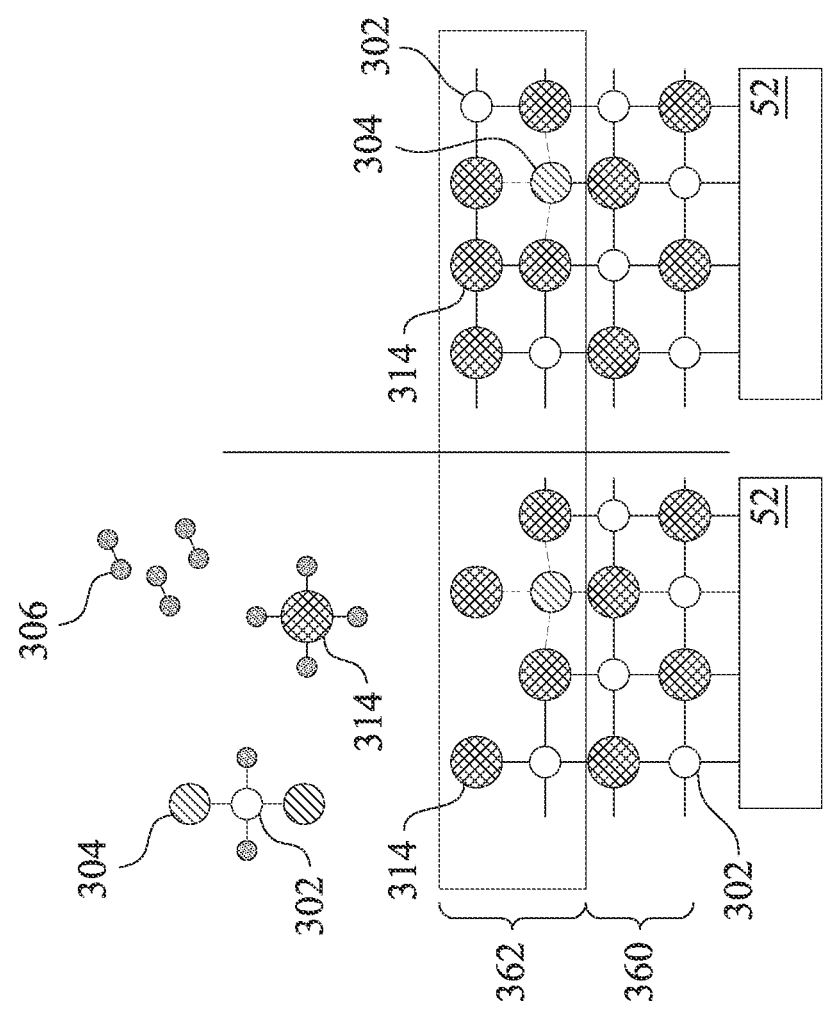

In FIG. 22, another cycle of the epitaxial growth process may be performed to continue growing the epitaxial region while also filling the vacancy 320 from the removal of a chlorine atom 304 and the vacancy 322 formed from the removal of a silicon atom 302. Disregarding any deposition preferences between silicon atoms 302 and germanium atoms 314, the resulting proportions within the surface layer 362 may have increased due to slightly more silicon atoms 302 being etched during the prior hydrogen radical treatment than germanium atoms 314. As such, the hydrogen radical treatment and subsequent epitaxial growth process may be utilized to tune the composition of the surface layer 362 by adjusting the germanium concentration higher and the silicon concentration lower.

In some embodiments, the surface layer 362 may be initially formed by flowing a silicon precursor and a germanium precursor, such as dichlorosilane and germane (GeH$_4$), over the fin 52, although any suitable precursors may be used. The silicon precursor may be flowed at a proportion of about 40% flow percent to about 80% flow percent, and the germanium precursor may be flowed at a proportion of about 20% flow percent to about 60% flow percent. The resulting surface layer 362 (and intermediate layer 360) may comprise analogous proportions of the silicon atoms 302 and the germanium atoms 314, including about 50% of each. For example, dichlorosilane, may be flowed at a rate of up to about 3000 sccm, and germane may be flowed at a rate of up to about 3000 sccm. The deposition chamber 208 may be maintained at temperatures of between about 500° C. and about 850° C. and at pressures of between about 3 Torr and about 500 Torr.

The hydrogen radical treatment may then be performed to result in an increase in the germanium proportion by about 4% in a surface portion of the surface layer 362 than in an inner bulk portion of the intermediate layer 360. For example, if the germanium proportion in the surface portion of the surface layer 362 was initially about 50%, then the germanium proportion in the surface portion following the hydrogen radical treatment may be greater than 50%, such as up to about 54%, and the silicon proportion would change from about 50% to less than 50%, such as down to about 46%.

Therefore, the hydrogen radical treatment may be used to tune the silicon and germanium proportions in the surface layer 362 and yield a gradient of those concentrations through the epitaxial source/drain region 82 (e.g., including the surface layer 362 and the intermediate layer 360). The gradient may further result from the hydrogen radicals 312 more effectively reaching and etching the silicon atoms 302 and the germanium atoms 314 from exposed portions of the surface layer 362 as compared to diffusing much deeper to remove the silicon atoms 302 and the germanium atoms 314 from the intermediate layer 360. As described above, in some embodiments, the epitaxial layer 362 is formed similarly as described in connection with FIG. 17 such that the epitaxial growth process and the hydrogen radical treatment are performed in cycles, wherein the epitaxial growth process is partially performed in each cycle until being completed in the last cycle. Process parameters of each epitaxial growth process and each hydrogen radical treatment may be adjusted in order to control the amount of the surface layer 362 that is formed in each epitaxial growth process cycle as well as the degree to which the silicon and germanium proportions are altered in the surface layer 362 during each hydrogen radical treatment cycle.

Figure 23B:
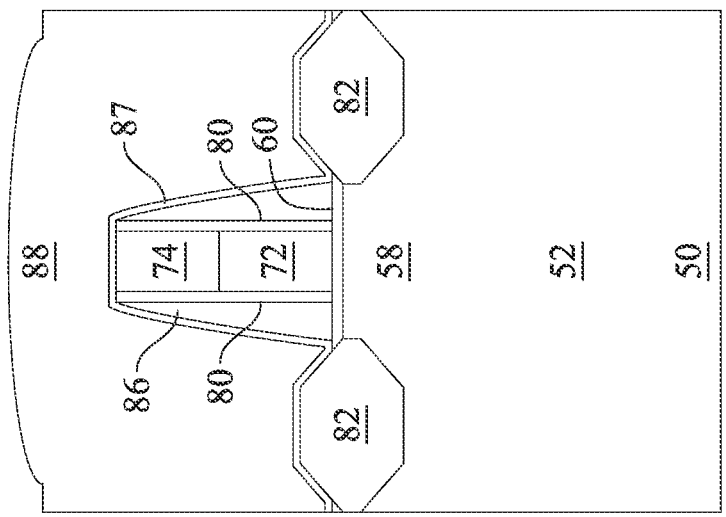
FIGS. 23A, 23B, 24A, 24B, 25A, 25B, 26A, 26B, 26C, 27A, 27B, 28A, and 28B are cross-sectional views of intermediate stages in the manufacturing of FinFETs, in accordance with some embodiments.
Figure 23A:
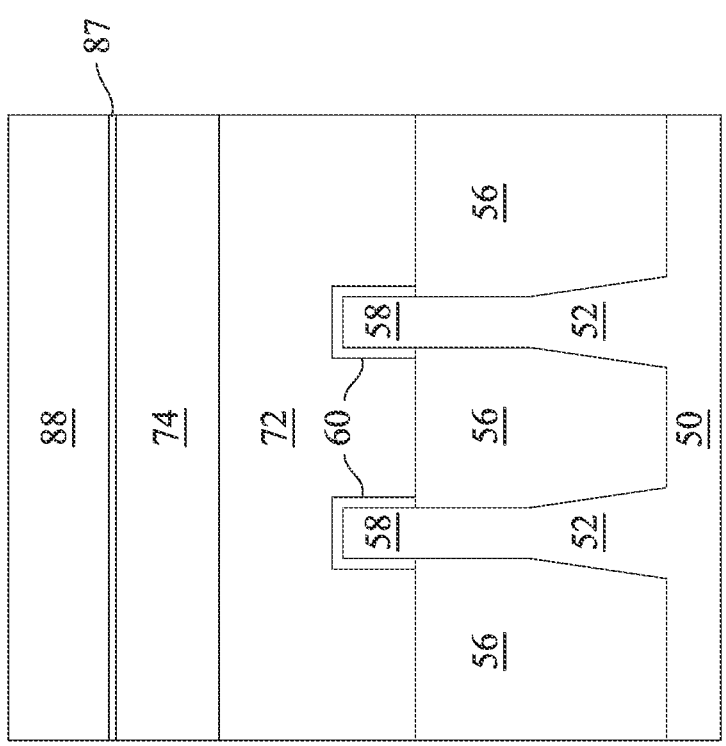

In FIGS. 23A and 23B, a first interlayer dielectric (ILD) 88 is deposited over the structure illustrated in FIGS. 10A and 10B, including over the epitaxial source/drain regions 82. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a lower etch rate than the material of the overlying first ILD 88.

Figure 24B:
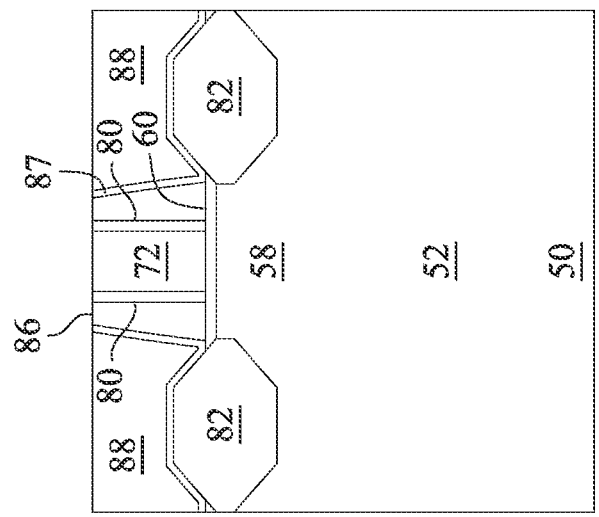
Figure 24A:
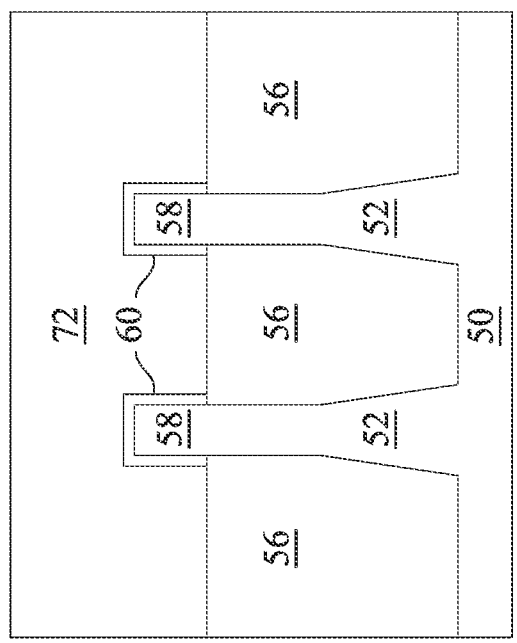

In FIGS. 24A and 24B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the masks 74.

Figure 25B:
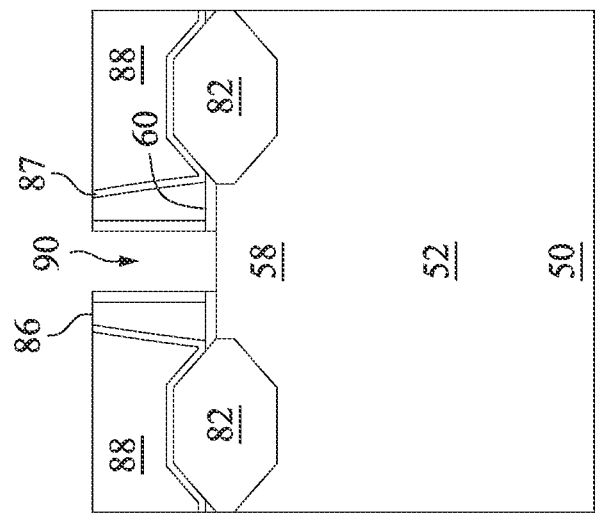
Figure 25A:
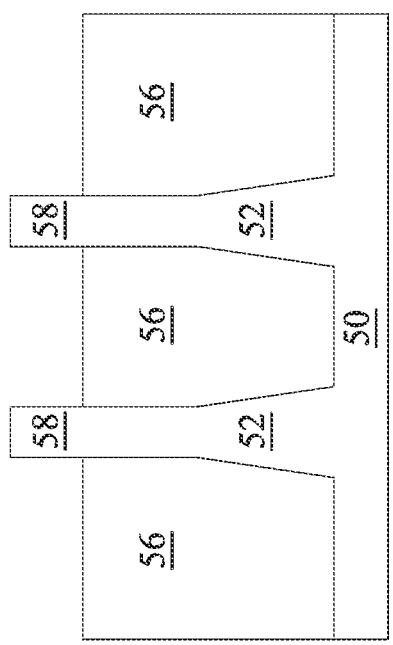

In FIGS. 25A and 25B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 with little or no etching of the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 26B:
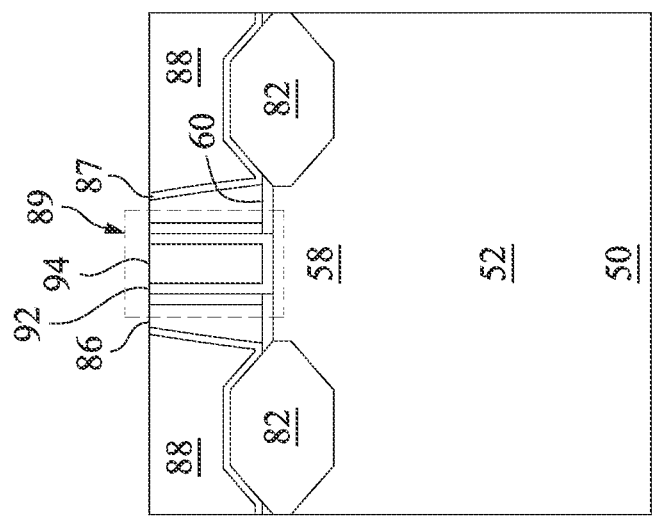
Figure 26A:
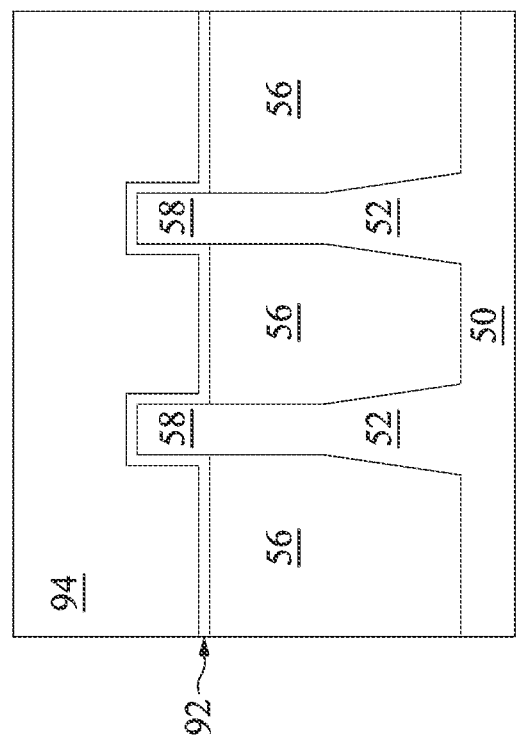
Figure 26C:
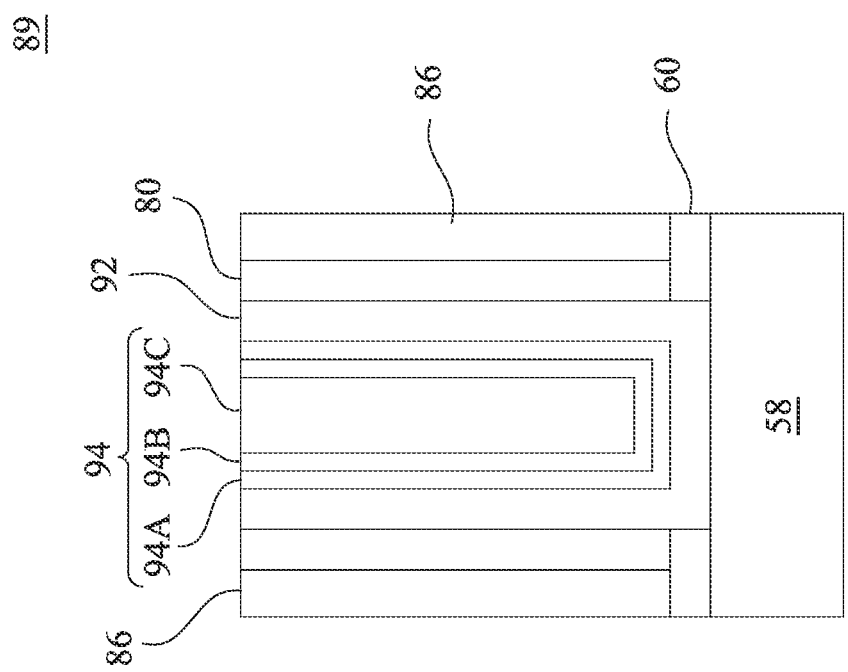

In FIGS. 26A and 26B, gate dielectric layers 92 and gate electrodes 94 are formed for replacement gates. FIG. 26C illustrates a detailed view of region 89 of FIG. 26B. Gate dielectric layers 92 one or more layers deposited in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 92 may include a dielectric layer having a k value greater than about 7.0. The formation methods of the gate dielectric layers 92 may include Molecular-Beam Deposition (MBD), ALD, PECVD, and the like. In embodiments where portions of the dummy dielectric 60 remains in the recesses 90, the gate dielectric layers 92 include a material of the dummy dielectric 60 (e.g., SiO$_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 26B, the gate electrode 94 may comprise any number of liner layers 94A, any number of work function tuning layers 94B, and a fill material 94C as illustrated by FIG. 26C. After the filling of the recesses 90, a planarization process, such as a CMP, may be performed to remove the excess portions of the gate dielectric layers 92 and the material of the gate electrodes 94, which excess portions are over the top surface of the first ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the n-type region 50N and the p-type region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 27B:
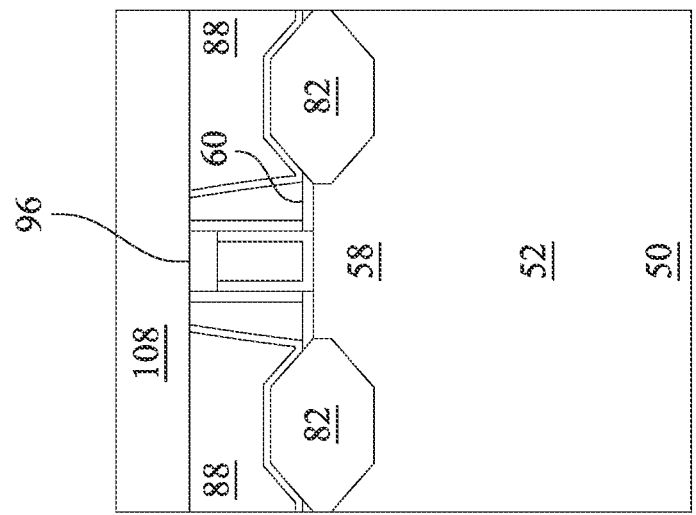
Figure 27A:
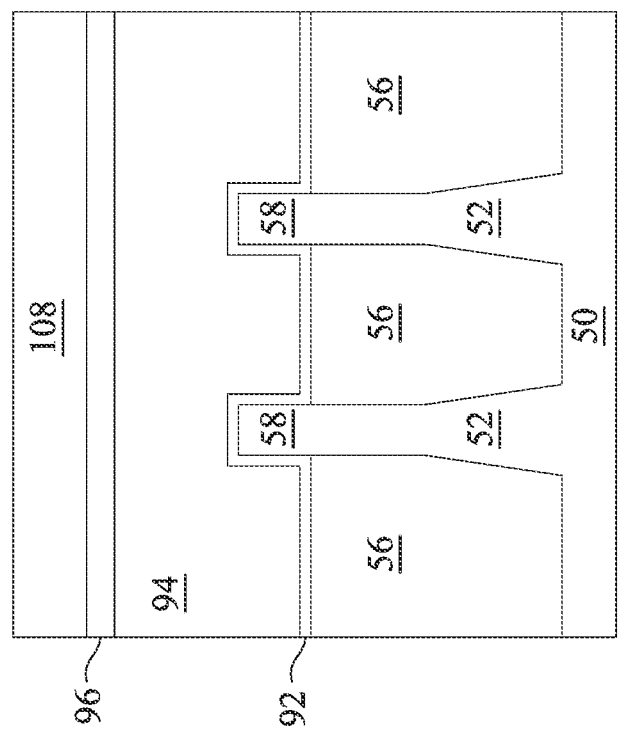

In FIGS. 27A and 27B, a gate mask 96 is formed over the gate stack (including a gate dielectric layer 92 and a corresponding gate electrode 94), and the gate mask 96 may be disposed between opposing portions of the gate spacers 86. In some embodiments, forming the gate mask 96 includes recessing the gate stack so that a recess is formed directly over the gate stack and between opposing portions of gate spacers 86. A gate mask 96 comprising one or more layers of dielectric material, such as silicon nitride, silicon oxynitride, or the like, is filled in the recess, followed by a planarization process to remove excess portions of the dielectric material extending over the first ILD 88.

As also illustrated in FIGS. 27A and 27B, a second ILD 108 is deposited over the first ILD 88. In some embodiments, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. The subsequently formed gate contacts 110 (see FIGS. 28A and 28B) penetrate through the second ILD 108 and the gate mask 96 to contact the top surface of the recessed gate electrode 94.

Figure 28B:
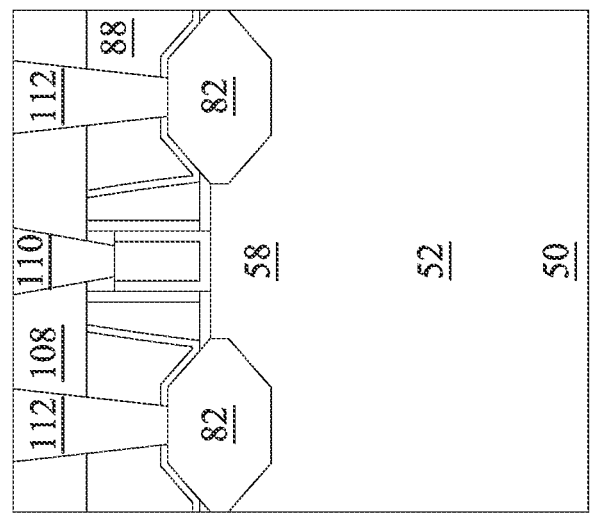
Figure 28A:
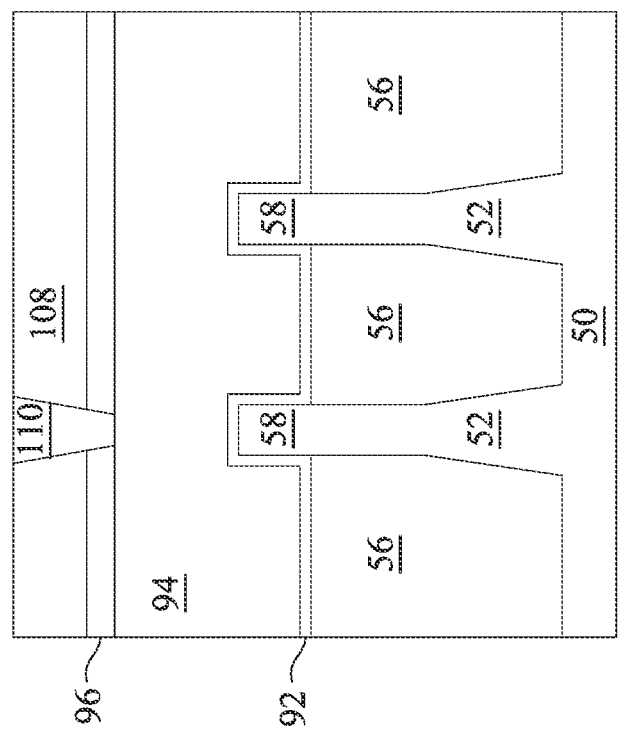

In FIGS. 28A and 28B, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contact 110 are formed through the second ILD 108 and the gate mask 96. The openings may be formed using acceptable photolithography and etching techniques. A liner (not specifically illustrated), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 106. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

Referring back to FIGS. 2-3, formation of portions of the substrate 50 or fins 52 may utilize the embodiments discussed above in connection with the epitaxial source/drain regions 82. For example, in embodiments in which portions of the substrate 50 or fins 52 are epitaxially grown to comprise silicon or silicon germanium, the formation may be performed in manners as described above, and may be formed in the same or different manner as the epitaxial source/drain regions 82.

In FIGS. 29A-D, some or all of the disclosed embodiments may be used on various semiconductor structures, such as metal-on-semiconductor field-effect transistors (MOSFETs), heterojunction bipolar transistors (HBT), or optoelectronics, where a semiconductor growth must be performed in a vertical and/or lateral direction. As shown in FIG. 29A, the disclosed embodiments may be used to form the substrate 50 (e.g., channel regions 58 located under gate electrode 94) and/or source/drain regions 82 in a planar transistor.

As shown in FIG. 29B and as discussed above, the disclosed embodiments may be used to form portions of fins 52 (e.g., channel regions 58) and/or source/drain regions 82 in a FinFET. Note that the FinFET illustrated in FIG. 29B is not necessarily the same as the FinFET described and illustrated in the embodiments elsewhere in this disclosure. The FinFET illustrated in FIG. 19B is provided for comparison purposes.

Still referring to FIG. 29B, the disclosed FinFET embodiments could also be applied to nanostructure devices such as nanostructure (e.g., nanosheet, nanowire, gate-all-around, or the like) field effect transistors (NSFETs). In an NSFET embodiment, the fins 52 are replaced by nanostructures formed by patterning a stack of alternating layers, which are eventually etched to form a stack of channel layers 58 and sacrificial layers (not specifically illustrated). As such, the disclosed embodiments may benefit formation of those fins (e.g., the channel layers 58 and the sacrificial layers). Dummy gate stacks (not specifically illustrated) and source/drain regions 82 are formed in a manner similar to the above-described embodiments. In addition, the disclosed embodiments may benefit formation of the source/drain regions 82. After the dummy gate stacks are removed, the sacrificial layers can be partially or fully removed in the channel regions. The replacement gate structures 94 are formed in a manner similar to the above-described embodiments, the replacement gate structures may partially or completely fill openings left by removing the sacrificial layers, and the replacement gate structures 94 may partially or completely surround the channel layers in the channel regions 58 of the NSFET devices. ILDs and contacts (not specifically illustrated) to the replacement gate structures and the source/drain regions 82 may be formed in a manner similar to the above-described embodiments. A nanostructure device can be formed as disclosed in U.S. Patent Application Publication No. 2016/0365414, which is incorporated herein by reference in its entirety.

Referring to FIG. 29C, the disclosed embodiments may be used to form fins 52 and/or source/drain regions 82 in a lateral gate-all around nanostructure transistor as described above or a vertical gate-all around nanostructure transistor. The vertical gate-all around nanostructure transistor may be formed by forming a bottom contact 404 over a substrate, forming a dielectric layer (not specifically illustrated) over the bottom contact, forming openings through the dielectric layer, epitaxially growing wires 402 (including channel regions 58 located under a gate electrode 94) upward through the openings, forming the gate electrode 94 around the wires, and forming a top contact 406 over the wires 402. For example, as discussed above, the disclosed embodiments may be used to form the wires 402.

Referring to FIG. 29D, the disclosed embodiments may also be used to form source/drain regions 82 in a negative capacitance field-effect transistor (NC-FET). The NC-FET may be formed by forming a high-k dielectric 408 over a substrate, forming a metal layer 410 over the high-k dielectric 408, forming a ferroelectric layer 412 over the metal layer 410, and forming a gate 414 over the ferroelectric layer 412. In addition, as discussed above, the disclosed embodiments may be used to form channel region 58 and/or source/drain regions 82 on opposing sides of the structure.

In an embodiment, a method includes flowing first precursors over a semiconductor substrate to form an epitaxial region, the epitaxial region includes a first element and a second element; converting a second precursor into first radicals and first ions; separating the first radicals from the first ions; and flowing the first radicals over the epitaxial region to remove at least some of the second element from the epitaxial region. In an embodiment, the method further includes after flowing the first radicals, flowing third precursors over the epitaxial region. In an embodiment, the method further includes after flowing the third precursors: converting a fourth precursor into second radicals and second ions; separating the second radicals from the second ions; and flowing the second radicals over the epitaxial region. In an embodiment, the first precursors and the third precursors include the same material, and wherein the second precursor and the fourth precursor include the same material. In an embodiment, the flowing the first precursors and the flowing the first radicals are part of a first cycle, and wherein the method further comprises repeating the first cycle so that a total number of cycles is less than or equal to 5. In an embodiment, a total duration of the flowing the first radicals within all of the first cycles is less than or equal to about 50 seconds. In an embodiment, the epitaxial region comprises a same shape before and after flowing the first radicals over the epitaxial region. In an embodiment, the first precursors comprise a silicon precursor, a chlorine precursor, and a germanium precursor, and wherein the second element is chlorine. In an embodiment, the flowing the first radicals over the epitaxial region further comprises removing a first amount of silicon and a second amount of germanium, the first amount being greater than the second amount.

In another embodiment, a system includes a reaction chamber; a first set of precursor delivery systems, the first set of precursor delivery systems being operationally connected to the reaction chamber; a first epitaxial deposition precursor within a first one of the first set of precursor delivery systems; a plasma chamber, the plasma chamber includes an ion filter; a second precursor delivery system, the second precursor delivery system being operationally connected to the plasma chamber, the plasma chamber further being operationally connected to the reaction chamber; and a treatment precursor within the second precursor delivery system. In an embodiment, the first epitaxial deposition precursor includes silicon. In an embodiment, the system further includes a second epitaxial deposition precursor within a second one of the first set of precursor delivery systems, the second epitaxial deposition precursor includes chlorine. In an embodiment, a third epitaxial deposition precursor within a third one of the first set of precursor delivery systems, the third epitaxial deposition precursor includes germanium. In an embodiment, the treatment precursor includes hydrogen gas. In an embodiment, the plasma chamber is configured to convert hydrogen gas into hydrogen radicals, and wherein the ion filter is configured to block ions from flowing from the plasma chamber to the reaction chamber.

In yet another embodiment, a semiconductor device includes a gate structure disposed over a substrate; an interlayer dielectric (ILD) layer disposed over and around the gate structure; and an epitaxial source/drain region laterally displaced from the gate structure, the epitaxial source/drain region comprising chlorine, the epitaxial source/drain region further comprising a bulk region and a surface region, the surface region interposing the bulk region and the ILD layer, the surface region comprising a chlorine concentration of greater than zero and less than about $1 \times 10^{18}$ atoms/cm3. In an embodiment, the epitaxial source/drain region further comprises silicon and germanium. In an embodiment, a germanium concentration of the surface region is greater than a germanium concentration of the bulk region. In an embodiment, an overall silicon concentration of the epitaxial source/drain region is greater than an overall germanium concentration of the epitaxial source/drain region. In an embodiment, a germanium concentration of the bulk region is greater than a germanium concentration of the surface region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   flowing first precursors over a semiconductor substrate to form an epitaxial region, the epitaxial region comprising a first element and a second element;
   converting a second precursor into first radicals and first ions;
   separating the first radicals from the first ions;
   flowing the first radicals over the epitaxial region to remove at least some of the second element from the epitaxial region; and
   after flowing the first radicals, flowing third precursors over the epitaxial region.

2. The method of claim 1 further comprising, after flowing the third precursors:
   converting a fourth precursor into second radicals and second ions;
   separating the second radicals from the second ions; and
   flowing the second radicals over the epitaxial region, wherein the first precursors and the third precursors comprise the same material, and wherein the second precursor and the fourth precursor comprise the same material.

3. The method of claim 1 further comprising, after flowing the first radicals, performing an etching process to induce hydrogen chloride over the epitaxial region.

4. The method of claim 1, wherein the flowing the first precursors and the flowing the first radicals are part of a first cycle, and wherein the method further comprises repeating the first cycle so that a total number of cycles is less than or equal to 5.

5. The method of claim 4, wherein a total duration of the flowing the first radicals within all of the first cycles is less than or equal to about 50 seconds.

6. The method of claim 1, wherein the epitaxial region comprises a same shape before and after flowing the first radicals over the epitaxial region.

7. The method of claim 1, wherein the first precursors comprise a silicon precursor, a chlorine precursor, and a germanium precursor, and wherein the second element is chlorine.

8. The method of claim 7, wherein the flowing the first radicals over the epitaxial region further comprises removing a first amount of silicon and a second amount of germanium, the first amount being greater than the second amount.

9. The method of claim 1, wherein the flowing the first radicals over the epitaxial region comprises increasing a crystallinity of the epitaxial region.

10. A method comprising:
   flowing a first precursor over a substrate to form a first epitaxial region, the first epitaxial region comprising a first impurity;
   converting a second precursor to a first radical and a first ion;
   filtering the first ion from the first radical;
   flowing the first radical over the first epitaxial region, the first radical reacting with the first epitaxial region to remove the first impurity;
   flowing a third precursor over the first epitaxial region to form a second epitaxial region over the first epitaxial region, the second epitaxial region comprising a second impurity;
   converting a fourth precursor to a second radical and a second ion;
   filtering the second ion from the second radical; and
   flowing the second radical over the second epitaxial region, the second radical reacting with the second epitaxial region to remove the second impurity.

11. The method of claim 10, wherein the first epitaxial region comprises a first silicon concentration and a first germanium concentration, the first epitaxial region further comprising a first ratio of the first silicon concentration to the first germanium concentration.

12. The method of claim 11, wherein flowing the first radical over the first epitaxial region etches some silicon and some germanium.

13. The method of claim 12, wherein after flowing the first radical, the first epitaxial region comprising a second ratio of a second silicon concentration to a second germanium concentration, the second ratio being less than the first ratio.

14. The method of claim 10 further comprising simultaneously with flowing the third precursor over the first epitaxial region, flowing an etchant over the first epitaxial region.

15. The method of claim 14, wherein the etchant comprises chlorine.

16. A method comprising:

forming a recess in a semiconductor fin;

forming an epitaxial region in the recess by flowing silicon-containing molecules and hydrogen molecules over the recess of the semiconductor fin, a surface layer of the epitaxial region comprises a lower crystallinity than a bulk portion of the epitaxial region; and flowing unbonded hydrogen atoms over the epitaxial region to increase crystallinity of the surface layer of the epitaxial region.

17. The method of claim 16, further comprising:

sending hydrogen gas through a plasma chamber; and converting the hydrogen gas into hydrogen ions and hydrogen radicals.

18. The method of claim 17, further comprising separating the hydrogen radicals from the hydrogen ions.

19. The method of claim 18, wherein flowing the unbonded hydrogen atoms comprises flowing the hydrogen radicals.

20. The method of claim 17, wherein before flowing the unbonded hydrogen atoms, the surface layer of the epitaxial region comprises a greater chlorine concentration and a greater vacancy concentration than the bulk portion.

* * * * *